United States Patent [19]
Williams

[11] Patent Number: 5,842,187
[45] Date of Patent: Nov. 24, 1998

[54] ELECTRICITY MONITORING SYSTEM

[75] Inventor: Paul Nicholas Williams, Etwall, United Kingdom

[73] Assignee: Optimum Solutions Ltd., Derbyshire, United Kingdom

[21] Appl. No.: 716,457

[22] PCT Filed: Mar. 22, 1995

[86] PCT No.: PCT/GB95/00636

§ 371 Date: Jan. 6, 1997

§ 102(e) Date: Jan. 6, 1997

[87] PCT Pub. No.: WO95/26065

PCT Pub. Date: Sep. 28, 1995

[30] Foreign Application Priority Data

Mar. 22, 1994 [GB] United Kingdom .................. 9405597
Oct. 25, 1994 [GB] United Kingdom .................. 9421489

[51] Int. Cl.⁶ ..................................................... G06F 17/60
[52] U.S. Cl. ...................... 705/412; 340/870.02; 702/61; 705/34
[58] Field of Search ................................ 324/103 R, 116, 324/140 R, 142; 340/870.02; 364/400, 483; 705/1, 34, 412; 702/61, 62, 64

[56] References Cited

U.S. PATENT DOCUMENTS

| | | | |
|---|---|---|---|
| 4,199,717 | 4/1980 | Germer et al. .......................... | 324/116 |
| 4,317,175 | 2/1982 | Sterling et al. .......................... | 705/412 |
| 4,465,970 | 8/1984 | DiMassimo et al. .................... | 324/116 |
| 4,511,979 | 4/1985 | Amirante ................................. | 364/481 |
| 4,731,547 | 3/1988 | Alenduff et al. .......................... | 307/85 |
| 4,819,180 | 4/1989 | Hedman et al. ......................... | 364/492 |

FOREIGN PATENT DOCUMENTS

| | | |
|---|---|---|
| 81/00619 | 3/1981 | WIPO . |
| 90/06612 | 6/1990 | WIPO . |

*Primary Examiner*—Edward R. Cosimano
*Attorney, Agent, or Firm*—Lowe Hauptman Gopstein Gilman & Berner

[57] ABSTRACT

An apparatus associated with a public electricity distribution network to determine charges for the supplied electricity where the period during which consumption is measured (the metered period) is longer than the period used for settling the price or value of the electricity (the settlements period) and where the charge can be determined for either the metered period or the settlements period. The apparatus further provides means for adjusting charges such that the total charges equals the total owed or that total minus a defined amount. Means are also provided whereby the apparatus does not require metered data from all consumers connected to the network. The apparatus also provides means for determining the value of the supplied electricity where a plurality of generation sites exist each of which separately valued.

48 Claims, 10 Drawing Sheets

Consumer unit - 301/1

Closure balancing unit - 300/1

300/2

Closure Balancing Unit -300/3

Consumer Unit - 303/1

Closure Balancing Unit - 300/4

Combined Consumer Unit - 304/1

Consumer unit - 303/3

ELECTRICITY MONITORING SYSTEM

FIELD OF THE INVENTION

The present invention relates generally to a method of and apparatus for determining charges for consumed electricity and more particularly to such a method and apparatus wherein a period during which consumption is measured is longer than a period used for settling the price of the electricity and where the electricity charge can be determined for either a metered period or a settlement period.

BACKGROUND ART

It is becoming increasingly desirable to enable the trading of electricity across either local, national or international boundaries. At present a system exists within the United Kingdom to enable the trading of electricity associated with a relatively small subset of consumers; this existing system is known as the Settlements system (or just Settlements). A general object of the present invention is to remove some of the technical barriers which are associated with the existing system and to provide a more flexible means to enable competition in supply to a greater set of consumers.

The purpose of Settlements is to calculate a financial charge for electricity consumed and determine the responsibility for that charge. To do this the system utilizes metering (at the consumers and at various points within the distribution network), communication to transfer information, and a means to determine the financial charges. Settlements may also be appropriate to the trading of other services, commodities and utilities, including gas. Therefore, while the present system is explained with respect to electricity, it can also applied to the trading of other similar products such as gas.

SUMMARY OF THE INVENTION

According to the invention there is provided a system for generating charging information for a distribution system comprising a distribution network, first metering means through which electricity is supplied to the network, and a plurality of second metering means through which electricity is supplied from the network to respective consumers, the first metering means generating readings at first intervals and the second metering means generating readings at second intervals which are substantially larger than the first intervals, characterized by means for generating, for each second metering means, a charge value dependent on the combination of a reading for that metering means with the sequence of readings for the first metering means.

The present system relates to the means for determining a financial charge for consumed electricity. In the present system, conventional means of metering the utility service (for example electricity) and suitable means for communicating metered data to the Settlements system are assumed. Metered data can be communicated via modem and telephone lines if the meter is equipped with a suitable communication port. Or smart cards, hand-held units, or manual meter readings can be used with the data being fed into the Settlements system via appropriate means such as a unit capable of interrogating smart cards or hand-held units or, in the case of manual meter reading, a terminal for data entry of the meter readings.

Various further features of the invention will become apparent from the following detailed description of various embodiments thereof, given by way of example and with reference to the drawings, in which:

DETAILED DESCRIPTION OF THE DRAWINGS

Figure 1:
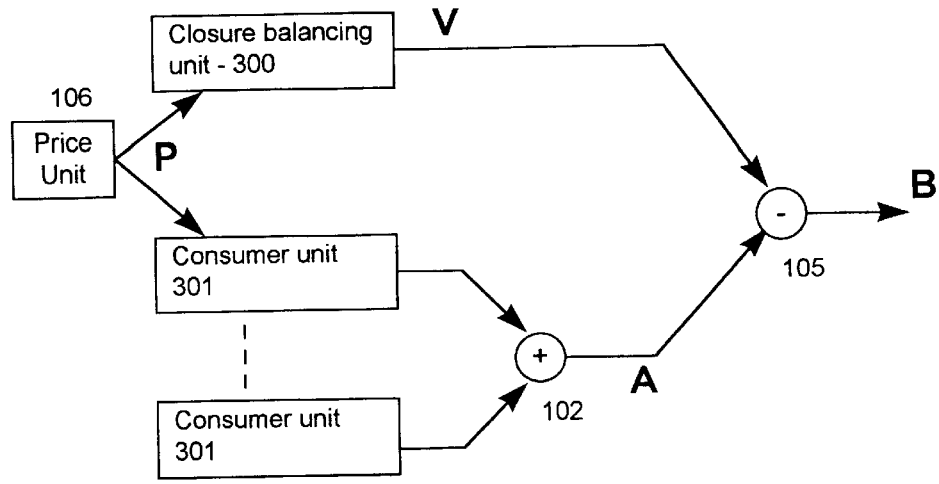
FIG. 1 shows the current Settlements system.

The existing Settlements system works using defined periods (Settlement Periods) as its basis. Generally these are relatively short periods, for example 1800 s (30 minutes). Also, the existing system illustrated in FIG. 1, only includes a small number of consumers and the method for determining the financial charges is relatively simple. FIG. 1 shows this system, in which there are units 301/1 to 301/n for the consumers. Separate to the Settlements system, another system (shown as a price unit 106 in FIG. 1) is used to determine a price for each Settlements Period. At present, in the case of electricity, this price is a per unit price.

DESCRIPTION OF THE PREFERRED EMBODIMENT

The present system is intended as an improved Settlements system. However, the present system includes further extensions to replace some of the system currently used to determine price (unit 106) and in so doing enable a more flexible and powerful overall system which overcomes several of the limitations associated with the existing systems.

Figure 2:
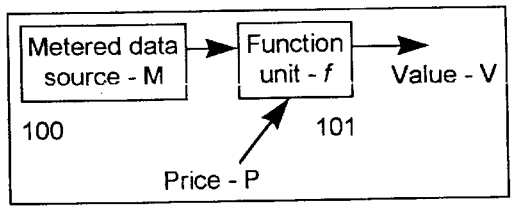
FIG. 2 shows unit 301/1 of FIG. 1.

Each consumer explicitly included within the Settlements system (herein referred to as an A consumer) is represented in the FIG. 1 by a unit 301. A plurality of such units will generally exist, although as mentioned the number is at present relatively small. The purpose of unit 301 is to determine for each consumer the value of electricity consumed in a given Settlement Period. FIG. 2 shows the existing method for this (the implementation identified as 301/1). Metered data is generated by unit 100 the output of which, representing the consumer's metered consumption for a given period, is fed to unit 101. Unit 101 implements the function to determine the value of electricity.

Metered data from each consumer is retrieved, commonly by means of telephone line and modems. Each unit 101 implements a function which is based upon metered data and price. Currently the function is:

$$\text{Consumption} \times \text{Price} \qquad (1)$$

In this function either price or consumption is scaled by a constant to adjust for an estimated value of loss associated with the distribution, for example, of electricity. Unit 101 can therefore be implemented using a multiplier capable of multiplying the three values (consumption, price, and loss factor).

Potentially, if the meters at consumers were provided with the price for each Settlement period, then unit 101 could be integrated within the meters.

In FIG. 1 the output from each 301 unit (which is the value, or financial charge, for the associated consumer in a given period) is connected to unit 102 which totals, for a period, the charges calculated by all 301 units (there being one per A consumer). The output of unit 102 represents the total value, for each period (or for a given period), of all consumers included within Settlements (all A consumers).

Settlements is currently applied only to a relatively small number of consumers. The majority of consumers are therefore not accounted for on an individual basis by the Settlements system. They are therefore implicitly under the control of one supply company. The output of unit 102 is labelled "A" to denote the total of all consumers explicitly within Settlements.

Beside the metering at consumers, there is also metering at certain points within the distribution network used to supply the consumers. It is generally possible to define a section of the distribution network (referred to herein as a Closure) where the points at which electricity is supplied into the Closure are all metered and where the outlets are known and usually metered (some consumption points are not metered because their consumption pattern is relatively constant and/or can be predicted—an example commonly being street lighting).

Closures can also be defined where an output from the closure is a point within the distribution network, such as a substation or transformer, which has suitable metering. Therefore Closure inputs and outputs can be points within the distribution network. However, the existing system is only applied to situations where the Closure output are consumers (ie they are not substations or transformers).

Figure 3:
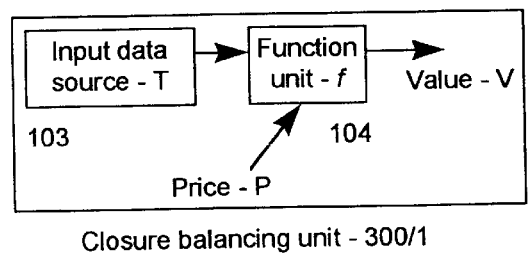
FIG. 3 shows unit 300/1 of FIG. 1.

In FIG. 1, unit 300 determines the total value V for a given period of electricity supplied within a particular Closure. Currently unit 300 is implemented as shown in FIG. 3. Unit 103 represents the total metered data for the input(s) to the Closure for a given period. This data will be provided to the system by means of suitable conventional metering and communication technology. The output of unit 103 is connected to unit 104 which determines a corresponding value for the electricity.

Unit 104 is similar, in the existing system, to unit 101, and implements the function:

$$\text{Consumption} \times \text{Price} \qquad (2)$$

but without the need for loss adjustment, since it is associated with the inputs to a Closure. This can therefore be implemented with a multiplier having two inputs—consumption (metered data) and price (obtained from unit 106).

The existing system is only applied to the distribution network between high-voltage substations (Grid Supply Points, GSPs) and end consumers. In such situations the Closure for settlements is therefore the network connecting the GSPs to consumers (via intermediate transformers and substations as required). Frequently there will only by one input to a Closure (from a higher level voltage network).

Figure 4:
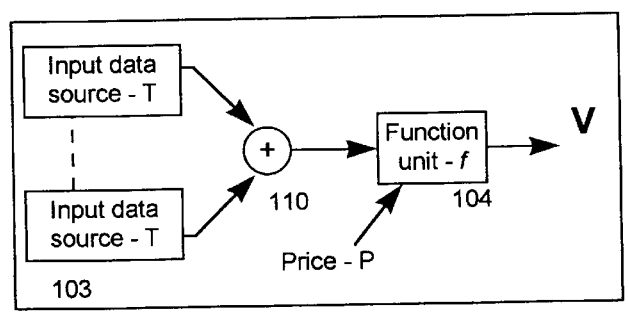
FIG. 4 shows a development of the unit of FIG. 3.

In the existing system for Settlements, multiple inputs could be combined as far as Settlements is concerned and treated as a single point (although the system is intended for situations where there is only one input). Unit 300/1 can therefore be extended to support multiple inputs to a Closure, as shown in FIG. 4. For a given period the metered data from the units 103 (replicated for each input) is added using unit 110 and then a function applied by unit 104. This function is simply the total number of units of electricity supplied into the network in a given period multiplied by the defined price per period. In the existing system, unit 104 in FIG. 4 is equivalent to the unit 104 in FIG. 3. It is also equivalent to the function implemented by unit 101 (except that it does not scale for loss).

In a given Settlements Period it is relatively simple in the existing system to determine the charge for "B" consumers (all non-A consumers) as the difference between the value V (output of unit 300) and the charge for all A consumers (the output of unit 102). This is performed by unit 105 (FIG. 1), whose output is the charge, for a given period, for all B consumers—ie all of those consumers not explicitly included in Settlements and represented by a unit 301. The output of unit 105 implicitly contains an amount equal in magnitude to the error in the loss estimated for all A consumers in each of the units 101.

For B consumers a single total charge is presently acceptable since they are all managed by a single supply company; therefore as far as Settlements is concerned the charge does not need to be further sub-divided or determined on an individual consumer basis. However, a number of supply companies could, in a competitive market, by responsible for A consumers. The output of unit 102 thus represents the total charge, per period, for all of these supply companies, and the system needs to also determine a charge for each company.

Figure 5:
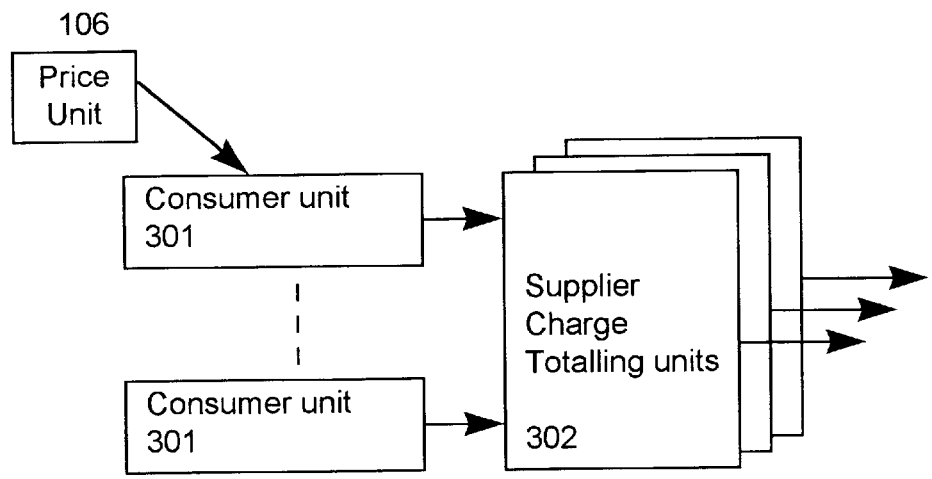
FIG. 5 shows means for determining supplier charges.

FIG. 5 shows the existing method of determining a charge for individual supply companies. Units 106 and 301 are those shown in FIG. 1. For each possible supplier there is a respective unit 302 which is fed with the outputs from each and every unit 301. The output of each unit 301 represents, for a given Settlement Period, the charge for the associated consumer. The purpose of unit 302 is to total those charges for consumers supplied by a particular company and produce the charge to that supplier.

Figure 6:
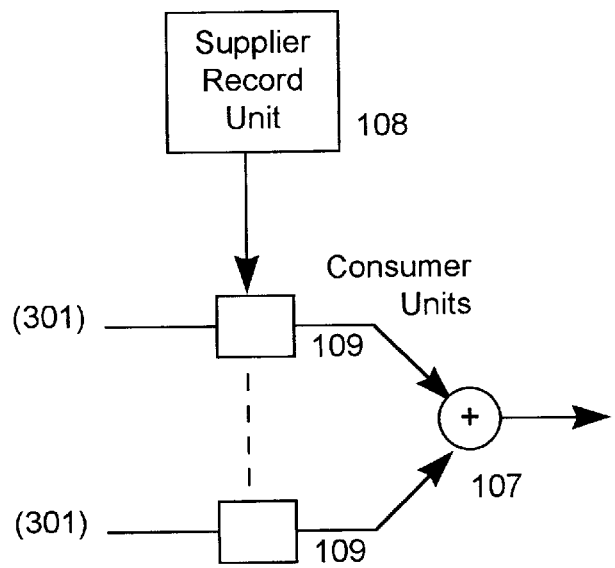
FIG. 6 shows unit 302 of FIG. 5.

FIG. 6 shows a unit 302/1 implementing this. A supplied record SUP REC unit 108 provides a record of which consumers are supplied by the particular supply company. This information is fed to a plurality of units 109 each of which is associated with a consumer. The output of unit 109 is either zero, if the consumer isn't supplied by the associated supply company, or is the charge for the consumer (ie it equals the input to the unit generated by the associated unit 301). Unit 107 then totals all charges (the outputs of all units 109 in a particular unit 302) to produce a total charge for the particular supply company.

Figure 7:
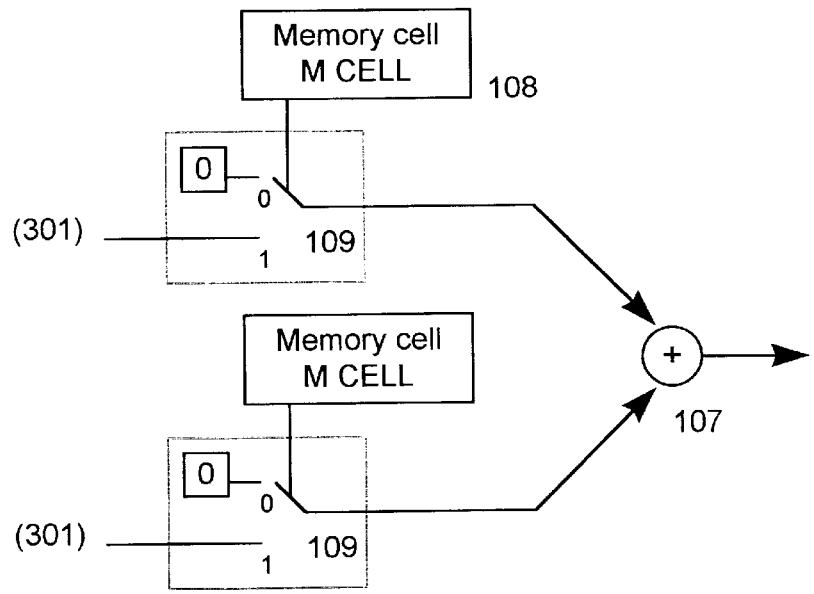
FIG. 7 shows units 108 and 109 of FIG. 5.

FIG. 7 shows one form of units 108 and 109. The supplier record is implemented as a number of memory cells M CELL 108 which can be programmed by some means. A 0 indicates that the associated consumer isn't supplied by that supply company, a 1 that the consumer is supplied by the company. Each memory cell is connected to a respective unit 109 which contains a simple switch (or multiplexor) the output of which is zero if the associated memory cell contains a 0; if the memory cell contains a 1 then the output of the associated unit 109 will be the consumer's charge.

Finally, in the existing system, units 100 and 103 both record consumption information per Settlements period. However, they represent different locations within the distribution network. The distribution network is used to connect the inputs points and the consumption points. However, in doing so electrical losses will be incurred (in the case of an electricity distribution network). Also illegal abstraction can also occur from the distribution network. Thus even if all input and consumption points were metered for an identical period the total electricity supplied into the network would not equal that legally consumed from the network.

To compensate for these losses, an adjustment is required, as referred to briefly above. It is currently achieved by scaling either (i) the output of units 101, or (ii) scaling units 102 and 107, by a defined constant. Alternatively, the price used in unit 101, or the output of unit 100, can be scaled by a similar constant.

The output of unit 300 in FIG. 1 is referred to as V and is the total value, for the associated Closure, of the electricity supplied into the Closure in a given period.

The system described so far can, for a given Settlements Period, determine the charge for an individual A consumer, the total charge per supplier, the total for all A consumers, and the total for all B consumers. To enable this the metered data for the given period needs to be available from units 100 and 103. Also the price for the electricity supplied in that period needs to be determined by unit 106.

As will be explained later, the system can be extended to support multiple periods. Alternatively, an external means could be used to set-up the Settlements system with the required input data, allow the system to determine the charges, and then retrieve the results from the system. This external system could then support the storage of data for multiple periods and could, if required, use the Settlements system to re-determine the charges if, for some period, input data changed.

Figure 8:
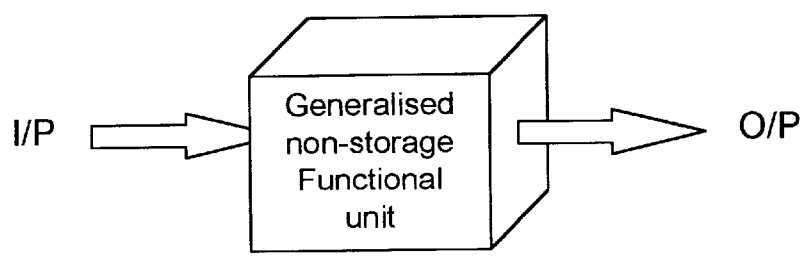
FIG. 8 shows a simple mode of operation for the Settlements system.

FIG. 8 shows a simple mode of operation for the Settlements system. The units within the system simply operate on their instantaneous inputs I/P to provide an output value O/P. No data or values need to be latched or stored within the system. The system can therefore be viewed as a large functional unit into which input values are presented and from which results can be extracted.

In such a situation an external system can be used to collate the input and output data for each period, and then use the FIG. 8 system to determine charges for a given period using the available data. Using such a solution the data for a period can be provided to the system, which will then determine the output results for the same period. Therefore the system can be used to determine the charges a period at a time. If any input data for a period subsequently changes (for example the price determined by unit 106 is revised), then the system can be used to the generate new results for the particular period.

Alternatively, logic can be duplicated to enable multiple periods to be supported simultaneously. Potentially this would require the duplication of the circuitry at each stage, as partially shown in FIG. 9. If n periods are to be supported then each unit will have to be replicated n times. Rather than replicate all units, it may be possible in a particular configuration to merge or combine data at some points. Thus in FIG. 9 the multiple outputs of unit 102 could all be added together, by a unit not shown, to give a total for the associated periods. Where the results for individual periods are not required in subsequent units this may save some circuitry and complexity.

In specific implementations it may be necessary for the validity of data to be determined at some (or all) stages. Thus the connection between units may include additional signals to indicate the validity of data or even a value representing the Settlement period for the data. A simple validity signal could be represented as a single binary value. Where a unit uses multiple inputs to determine an output, then it may be that the validity signal for the output represents the wired-AND of the validity signals for the associated inputs.

Figure 10:
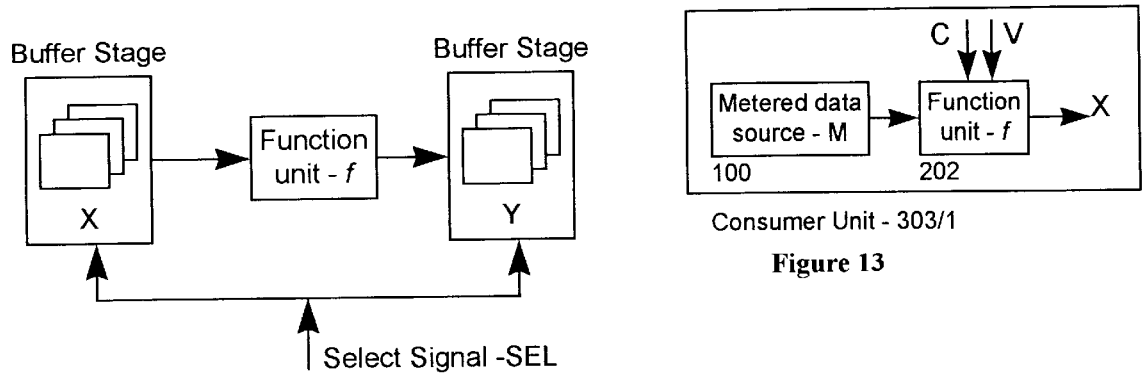
FIG. 10 shows a system with latching between units.

If the system is required to support a considerable number of periods, then it may not be practical to duplicate functional units and their interconnection. However, it is reasonable to provide storage for the associated data in at least some stage of the system and then provide a means to enable (select) a particular stored value. FIG. 10 shows such a system. One stage (X) has a buffer, memory, or latches capable of storing associated data for a number of periods. Another stage (Y) is similarly constructed but with obvious regard to its own functionality. Between the two stages there may be one or more intermediate stages; however, only a single instance of these intermediate units is required. A select signal SEL controls the two stages X and Y. For stage X, the select signal will control the output of data and determine which memory, buffer, or latch location to read data from. For the last stage the select signal controls which location the input data is stored in.

Obviously which units are implemented as latched and which are simply functional units is an implementation trade-off. If stage X stores data for various periods then it is also possible to arrange for stage X to signal to control logic the availability of data or that an existing value has been modified. The control logic can then, at some point, enable that data.

Figure 9:
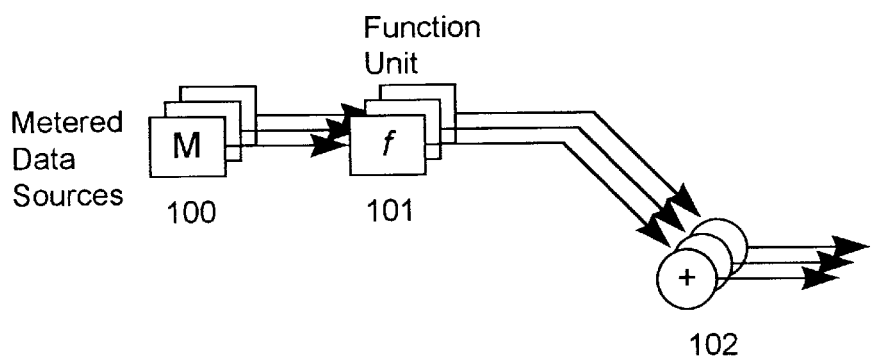
FIG. 9 shows a system with multiple units.

In FIG. 10, Stage Y could have multiple inputs for each period (say inputs J and K). Input J could be implemented and controlled as shown in FIG. 10. However, for input K a plurality of signals could be provided, one per period, as shown in FIG. 9. In such an implementation the select signal would be used to select the latched data in Stage X used to produce input J. Input K would be represented by a number of signals (or versions of the value) and the select signal can be used to determine which is enabled. This selection (enabling) can be achieved by a suitable multiplexor.

Alternatively input K could also be a single input which can be used to represent any selected period, as in FIG. 10. The select signal will then control the latched data used to produce both inputs (J and K). In such a situation the select signals associated with each of the inputs to Stage Y need to select the same period in their respective stages, otherwise the result of stage Y would be meaningless.

FIG. 10 implies that the data in a given storage location at a stage corresponds to the same Settlement Period as data in an equivalent location in another stage of the system. Storage address I in all stages should therefore be used for data representing the same period. The alternative is to either tag stored data with a period identifier or for the mapping of periods to locations in each stage to be known (but possibly specific to the individual stages).

Figure 11:
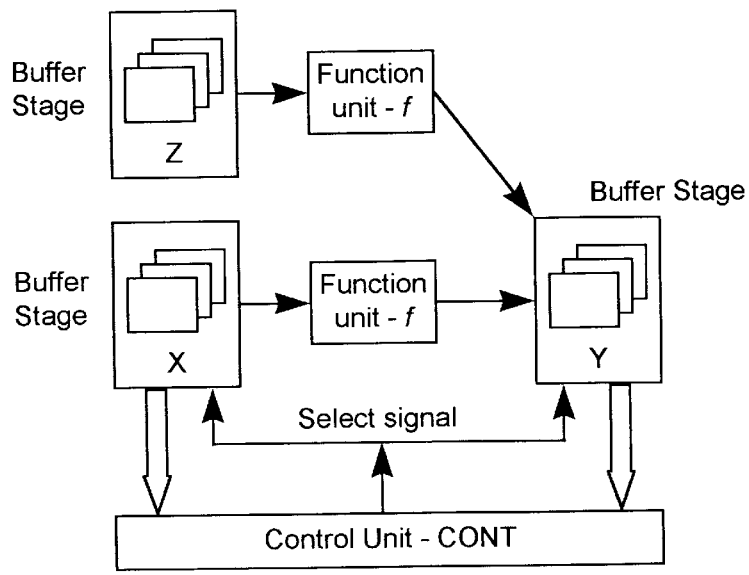
FIG. 11 shows a system with latching and convergent data paths.

FIG. 11 shows how validity (and possibly periodic information) may be used from each buffered unit to determine select signals generated by a control unit CONT. FIG. 11 shows three stage X, Y, and Z. Stage Y has inputs which are directly or indirectly generated from stages X and Z. Therefore the control (selection) of associated signals from X and Z needs to ensure that the signals relate to the same Settlement period to ensure meaningful data at stage Y. (Obviously this doesn't apply to signals which are constants or do not vary between particular periods.)

The control logic which generates the select signal can operate in a number of ways depending upon implementation requirements.

If each buffered stage contains N locations then the buffers (or memory or latches) can be organized such that the buffer operates in a cyclic manner to store data for given periods. Thus, for example, data for period 1 may be stored in location 1, data for period 2 stored in location 2, etc. Since the buffer in this example is cyclic, data for period N+1 will also be stored in location 1, so any previous data in a location must be used and removed before new data is stored in the location. If the storage is sufficiently large (or represents a cache to a large storage unit) then it may be practical to provide storage for all periods (or at least those representing the recent past).

The control logic can be designed to enable each period to be processed sequentially. It will therefore wait for data in location 1 in all source stages to be available (valid); the recipient stage will then use the input data and store the information (inputs and/or results) in its buffer before the control logic then selects location 2, and so on. In the example of a cyclic buffer being used then after location N the control logic will simply select location 1 again. Using this, the validity of the selected location in stage Y is simply the wired-AND of the validity signals for each of the inputs.

The control logic can therefore use the validity signal of the selected stage Y location (or a signal specifically generated by stage Y) to indicate that it can now select the next location in the stages X, Z, and Y. In stage X and Z the effect of the select signal changing (ie from enabling one location to another) could cause the validity of the first location to be cleared, making the location free to accept new data. As mentioned, stage Y could generate an explicit signal to indicate to the control logic that it has performed any necessary processing of the current data and therefore that the control logic can now select the next period. This would mean the validity signal from stage Y isn't necessarily used for such purposes. Stage Y (and other stages) can therefore be modified to ensure that existing data isn't overwritten. Stage Y can process the currently selected period when all input signals are valid and the associated location in stage Y isn't valid (ie it is empty).

Rather than process periods in order, the control logic can be modified to simply process periods (locations) when all source stages have valid data. This could be extended to be a condition of all source stages having valid data and the recipient stage having an empty (invalid) associated location. If the stages buffer both data and the period information for the associated data, then the requirement that data for a given period is stored in a specific location can also be removed. Then the control logic would have to ensure the selection of data from the same period. This could be done by a variety of techniques including logic decode of the stored period information or by using content-addressable memory.

It is also possible to implement the present system where stages request information they require. Thus stage Y could request (from either the control logic or the source stages) specific information such as the information for a particular period.

Alternatively, source stages, such as X and Z, can pass period data to recipient stages (Y), with the recipient (ie Stage Y in the figures) being responsible for the storage of the received data. Then a stage would be responsible for storing input data required for its function. When it has all of the input values required for a particular period it can generate a result and pass this to other stages requiring that result. Stage Y may or may not then store output values. In this implementation, stages would collate received data associated with individual periods and then determine output data which they then forward to dependent stages.

Stages could also be connected to some backup system such that data was stored (archived) before (or just following) being removed from a stage buffer.

The system as described so far provides a versatile structure to support consumers using metering capable of providing data for each settlement period. It also allows a "second" class, or tier, of consumer (the B consumers) who are grouped together and whose metering is not significant for settlements. A variety of means for implementing such a system have also been detailed above. However, it is desirable to provide greater flexibility and enable consumers with a greater diversity of metering, and metered periods, to be included within settlements rather than being accounted for on a collective basis by the value of B. It is also desirable to enable consumers with different metering, or metered periods, to be represented in the Settlements system.

In the existing system, although multiple periods can be supported as detailed above, the logic associated with producing the results for each period is separate. Data associated with one period has no affect on the results for another period.

Currently Settlements is only applied to situations where the consumption points are electricity consumers and the inputs to a given Closure are from high voltage networks. If a generation plant directly fed into a Closure then it would be treated as an input node and accounted for in the same manner as a connection to the high-voltage network.

The existing system relies on a single price being defined per period per unit of electricity, with this price being common to all input points to a Closure and hence, excepting network loss, all output points. As previously mentioned, the existing Settlements system is only applied to the distribution network between Grid Supply Points (GSPs) and end consumers. The GSPs are outlets from the national distribution network (known in England as the National Grid). The generation sites for electricity are connected to the National Grid. Currently the single price of electricity, for a given period, is applied to all generation (except where premiums are required by nature of location or fuel; in such circumstances these premiums are handled separately from the unit price of electricity).

Figure 12:
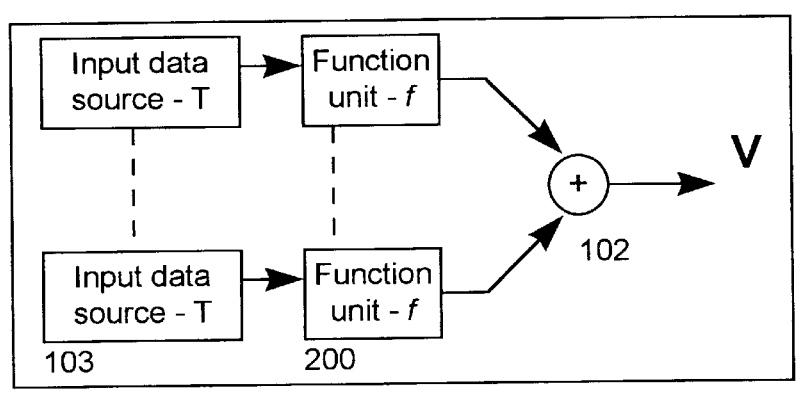
FIG. 12 shows a unit 300/3 for calculating total Value per period.

For a Closure the present system for Settlements can be extended, as an extension of the basic system, to calculate the value for each input individually and then to add each of the values to produce a total value. This is shown in FIG. 12, which shows a unit 300/3 for calculating total Value per period. Importantly, the units 200 can be different for each input to a Closure and can include a fixed charge and a charge for volume (number of electricity units supplied) which is non-linear. Thus the function implemented in unit 200 can be of the general form:

$$a+(b \times T)+([T>l_1] \times c \times T)+([T>l_2] \times d \times T)+([T>l_3] \times e \times T) \qquad (3)$$

where a to e and $l_1$ to $l_3$ are all individually (per Closure input) defined constants (per period), the square brackets [ ]

define a function which is 0 if $T<l_x$ and 1 if $T>l_x$, T is the number of metered units for that closure input, and $l_x$ is the associated l constant). Thus $[T>l_1]$ will be 0 if $T<l_1$ and 1 if $T>l_1$.

Note that such a method of determining the total value would not, in a specific situation, exclude either (i) all inputs to a Closure being accounted for on a similar basis, (ii) having a single price per unit defined for all inputs, or (iii) having the value determined as per the existing system. However, determining V by a unit 300/3 where each unit 200 implements the above function and where the value associated with each input is determined individually overcomes several technical limitations of the existing Settlements system; notably, that a single price is determined outside of Settlements which is then applied to all inputs on a per unit basis. Thus even if a system is used to determine a price for all electricity generated on a national basis (as unit 106 does currently), the present system would allow small generation systems, connected to local distribution networks, to be priced differently.

In function 3, any constant can be zero, and the function can be extended to provide any number of other variables. Also, the constants in function 3 can be used to represent any number of factors. For example, the constant a can be used to include a number of fixed charges associated with the Closure input such as the cost of operating systems, charges for constraints in the distribution network supplying that Closure input, or for "constraining on" generation stations (which is specific to the example of electricity supply).

The system described above is intended to support the values associated with individual inputs to a Closure. In the present system, other costs can also be defined and added per period either on a Closure basis or per node (input or output connection to) the Closure. Thus the cost of the distribution network, operating settlements, or other costs can be added to produce V for a given period.

If a Settlements system embodying the present system is then applied to the National Grid (the inputs to the Closure being the generation sites, or Grid interconnects, and the outputs being the GSPs) it will allow, for a Settlements Period, each generation site to have a unique charge (price) defined. The result will then be that the effective price per unit at GSPs is an average (weighted to number of units) of the generation costs. This is discussed below in more detail.

The present system is intended to enable multiple instances of the system to be applied to various Closures to provide a comprehensive solution. The effect of applying the present system to the National Grid is to provide a means to support, individually, the cost of generation and determine a value, in proportion to demand, at each supply point (GSP). Where a second Settlements system is associated with the distribution network supplied by a GSP then the value, for a period, at the GSP becomes an input value to the second Settlements system.

In the present system, the circuit implementing unit 301 can also be replaced by a modified unit 303. Each A consumer, directly included in the system, will be represented by a unit 303 (although it is noted that data for multiple consumers could be aggregated and supported by a single unit or that a single unit could be multiplexed to support multiple consumers).

Figure 13:
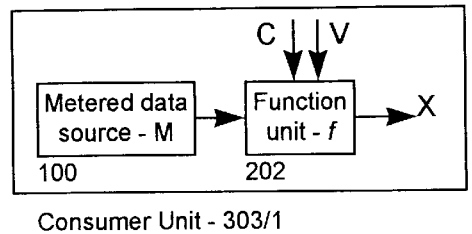
FIG. 13 shows a modified form of unit 301.

The basic implementation of unit 303 is shown as unit 303/1 in FIG. 13. In this unit, the periodic metered data is recorded and retrieved by conventional means shown as unit 100. In unit 301, periodic charges are determined using unit 101 as previously described. In unit 303, charges are determined by unit 202 which, rather than using metered data and a defined price per unit per period (from an external system), uses data derived from Closure inputs. In FIG. 13 unit 202 is shown having three inputs—metered data from unit 100, C, and V. C represents the total consumption supplied to a given group of consumers (which could be all consumers within the Closure), and V represents the corresponding value of the electricity (in the example of electricity distribution).

In the existing system the price determined by unit 106 is set on a national basis for each Settlements Period. Therefore, the price for a given period is constant irrespective of local conditions, location, or demand (local or individual). The present system enables the price to be determined by means allowing each Closure (which can be local rather than national) to determine a unique value or price for each Settlements Period. Also, if consumer metered periods are longer than the Settlements Period, it enables them to be charged a value (or price per unit) which reflects weighted price—accounting to the local or individual demand within the contained Settlement Periods.

The present system will be explained, using the supply of electricity as an example, using reference to data for C (supplied electricity) and V (the value of supplied electricity). Within the system, C and V can be produced for various periods for a whole Closure and also for groups of consumers or even individual consumers. Where data for C and V represent the same period, then the corresponding per unit price for electricity (at least for associated consumers) is obviously C divided by V. The system could be implemented and operated to use a price per unit (or similar). However, the present system is predominantly explained herein using C and V in order to provide consistency in the explanation of different implementation options and for clarity when dealing with a variety of periods. Nevertheless, the present system and circuits could equally be implemented using price data rather than, or together with, C and V.

Unit 303 and unit 202 can be explained by means of an example based upon using the Settlements Period for recording metered data C and V. For a given period, M (adjusted for network loss) divided by C will indicate the fraction of total consumption, during the period, which the associated consumer(s) was responsible for. Unit 202 can then determine a charge X as a similar fraction of V. Thus if in a particular period a consumer used 1% of C (the total electricity supplied) then 1% of V (the total value of C) will be apportioned to them. This can be expressed as:

$$f(M) \times (V/C) \qquad (4)$$

where the function of metered data f(M) can simply be the metered data multiplied by a loss factor.

Figure 14:
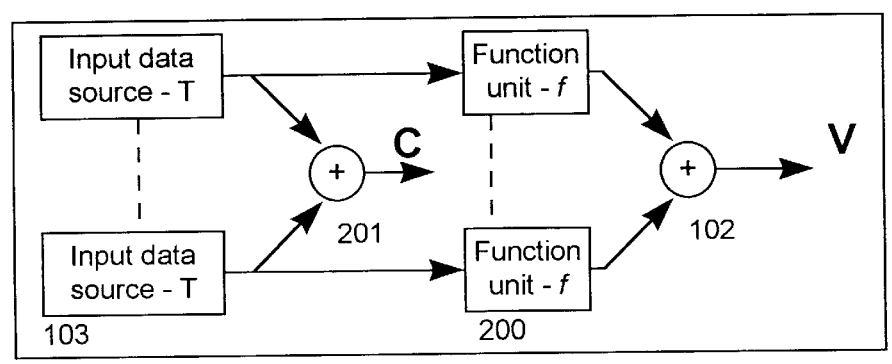
FIG. 14 shows a modified form of unit 300.

From FIG. 1 it can be seen that some or all of the units 301 can be replaced by units 303 if unit 300 is enhanced to also provide C (the total electricity supplied to the Closure). Unit 300 can be modified as shown in FIG. 14, unit 300/4. This also includes a means to have a unique value determined for each Closure input by means of one or more units 200, as described above.

Figure 15:
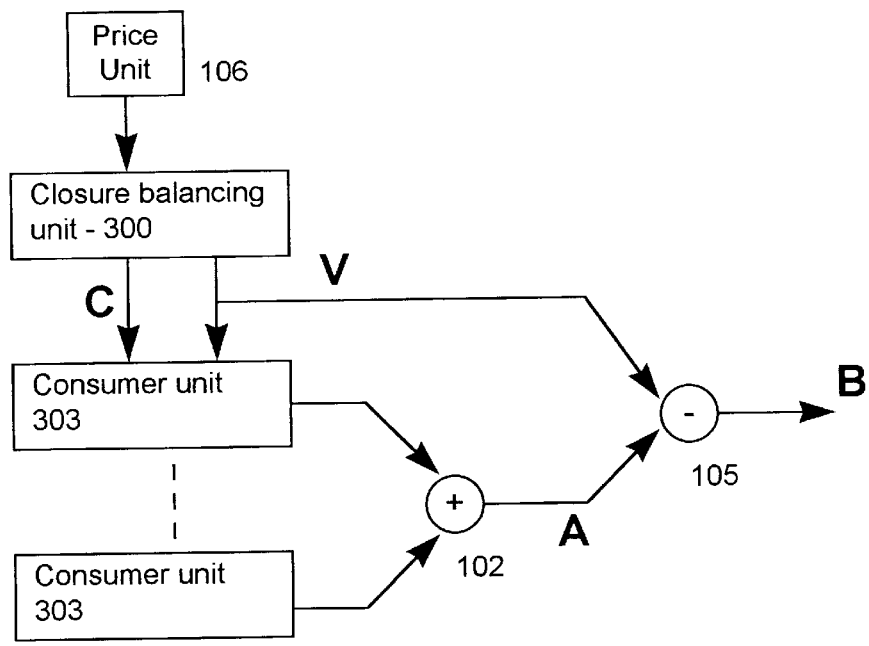
FIG. 15 shows a further form of the present system.

FIG. 15 shows a form of the present system where unit 300 provides C and V for each period (for example using Settlement Periods). A number of units 303 then represent A consumers to determine associated charges. If the metering for all A consumers uses the equivalent periods as for C and V, then the system shown in FIG. 15 will operate in substantially the same manner as the existing system except for the implementation of unit 202 (which replaces unit 101) and the modification to unit 300.

The existing system uses a defined set of periods (the Settlement Periods), which are currently all 30 minute periods. The operation of the present system does not require such a common set of periods for all A consumers. However, it is helpful, at least for explanation, to have a base set of periods. For this purpose the existing 30 minute Settlement Periods will be used as an example.

It is possible to define some other pattern of periods from the Settlement Periods. This can be referred to as Time Set 1. It is essential that Time Set 1 (as for all other sets of periods) represents the whole period of interest even though individual periods in the Time Set may represent non-continuous time. It is desirable, but not essential, for each period in Time Set 1 to correspond to an integral number of Settlement Periods (or some other base set of periods); but as stated, it is not important for a Time Set 1 period to represent continuous time provided that all Time Set 1 periods collectively represent the whole period of interest.

If we have a Time Set 1 period which represents an integral number of Settlement Periods, C and V for Time Set 1 periods can be defined as C1 and V1. Then, C1(i) and V1(i) can be produced for the i-th Time Set 1 period (assuming that periods are numbered or identified in some manner) simply by calculating the total of C and V respectively for all Settlement Periods contained in the i-th Time Set 1 period. If a Time Set 1 period contains a fractional part of a Settlements Period, then a corresponding fractional part of C and V can be used in the associated calculation. This could assume that C and V during a Settlements Period are flat (ie evenly distributed) and a fractional part therefore easily calculable. Alternatively, higher resolution data may be available or predictable (for example from power stations) which can be used to calculate the corresponding fractional part of C and V required to produce C1(i) and V1(i). In such situations C and/or V can be assumed, within the Settlements Period, to have the shape (profile) of the higher resolution data.

We can use the notation Cn(i) and Vn(i) to represent C and V data for the i-th period of Time Set n. Using this notation we can refer to the base set of periods (which we have said could be the Settlements Periods) as Time Set 0.

If all A consumers use metering which records consumption using Time Set 1, then the system shown in FIG. 15 can be modified such that unit 300 produces outputs for Time Set 1 periods, rather than Settlement Periods, even if price and/or Closure input metering is based upon Settlement Periods. This will therefore only require modification to unit 300 which may include buffering to store data for Time Set 0 periods required to calculate the necessary outputs.

In the present system, however, different A consumers can use different patterns of metered periods. Thus one consumer could use Settlement Periods for metering purposes and another could use Time Set 1. It would also be possible to defined a plurality of other Time Sets in a similar way to the definition of Time Set 1.

During the i-th Settlements Period, C0(i) will represent the total electricity supplied into a Closure and V0(i) it's total value. Therefore, for each period, V0/C0 will be the unit price P for the period. However, the present system is intended to support a range of consumer metering, metered periods and consumer groups and therefore the relationship between C, V, and P may be more complex and will, in part, relate to total consumption within the Closure or a group of consumers.

Initially, in a unit 303 of the present system, data for both C and V represents periods equal to the periods for the metered data available from unit 100. If C and/or V are available for periods shorter than the metered period then, given there are a finite number of such periods in a metered period, it is relatively easy to convert C and V to data values representing the required metered period as explained above. Thus if the Settlements period is 30 minutes, the metered period 4 times the Settlements period (2 hours), and C and V are available for Settlement Periods then, for a given 2 hour period, totaling C (and similarly for V) for each Settlement Period contained in the 2 hour period will provide a value for C for the longer metered period. This can be performed, using appropriate logic, with individual units 300.

If the C and V inputs to a unit 202 are expressed in terms of the metered period, then unit 202 can determine a charge as a fraction of V in proportion to the fraction of C represented by M (the metered data from unit 100). This can be expressed as:

$$f(M) \times (V/C) \qquad (4)$$

The function of metered data can also be used to implement an adjustment to account, in the example of electricity distribution, for network loss. Thus, a loss factor, L, can be defined and the charge determined by unit 202 then defined as:

$$M \times L \times V/C \qquad (5)$$

This will produce a charge X representing the charge for, in the example, electricity consumed during the metered period.

Alternatively, in the present system C and V could represent data for periods shorter than the metered period and charges could be determined for these periods (or permutations of them). For example, if C and V represent data for Settlement Periods (Time Set 0) then unit 303 could determine a charge X for each of the Settlement Periods even though the metered data M is only available for periods which are longer than the Settlements Period (where ideally the metered period equates to a integer number of Settlement Periods)—for example Time Set 1.

To achieve this, V1 is modified such that V1 for each Time Set 1 period contains a set of values with each being V for a contained sub-period. Thus if Time Set 1 represented a 2-hour period then V1 could be expressed in terms of Settlement Periods (Time Set 0) with each V1 Time Set 1 value containing, in this example, four Time Set 0 values. Thus:

$$V1(i) = \{a, b, c, d\}$$
$$V1(i, j) = a \text{ where } j = 1$$
$$= b \qquad j = 2$$
$$= c \qquad j = 3$$
$$= d \qquad j = 4.$$

In the case where V1 is produced directly from V0 then V1(i,j) will equal a corresponding value of V0.

Assuming consumer metered data for Time Set 1, then C1(i) can be calculated as the total of C0 for all Time Set 0 periods contained in the i-th Time Set 1 period. The function $$f(M) \times V1(i,j)/C1(i) \qquad (6)$$

can then be used to determine a charge for each contained Time Set 0 sub-period (j), contained in the i-th Time Set 1 period, for which V is available. M and C1(i) both correspond to the metered period (being a Time Set 1 period in this example). Function 6 can be used for each contained Time Set 0 period to apportion a percentage of V for that contained period. The function f(M) can be M×L to adjust for loss. Function 6 can be generalized such that M, the metered data, can be in a period in any Time Set (n) as:

$$f(M) \times Vn(i,j)/Cn(i) \tag{7}$$

Using this function the unit 202 can determine a charge X for each Time Set 0 period contained in a metered period. Obviously the same principle can be used to determine a charge for any other period contained in the metered period for which V is available or can be derived.

Assuming initially a situation where all A consumers have metering which records consumption for Settlement Periods (or at least some common period), then FIG. 15 shows an implementation of the present system. Unit 300 consists of a unit 300/4, as shown in FIG. 4, which produces C (the total electricity supplied into the Closure) and V (the total value for supplied electricity). C and V are fed to a plurality of units 303 which then determine charges for associated consumers. These charges are totaled using unit 102, as per FIG. 1, to produce A which can then be subtracted by unit 105, again as per FIG. 1, to produce B.

As described previously, suitable implementations of unit 303 can be used to support consumers where the metered period is longer than the Settlement Period (or at least the period represented by C and V). Also, even if the metered period is longer than that for V, the charges X produced by unit 303 can be determined for each period for which V is available (the V Periods). If suitable control or buffering is provided, it can be seen that individual units 303 can be used to support any metered period longer than that used for C and V (but ideally metered periods which contain integer number of V Periods). Thus, for example, C and V can be produced by unit 300 for each Settlement Period and these can, if necessary, be buffered or stored. Each unit 303 can then produce charges X for each Settlement Period irrespective of the metered period for their associated consumer(s).

To achieve this within a basic implementation of the present system, a unit 303 can convert the Time Set 0 values for C and V to other Time Sets as appropriate. Alternatively, groups of similarly metered consumers can be supported by one of units 304(1), 304(2) or 304(3), (referred to generically as 304), each of which includes associated unit 303 and which provides the circuitry shared by all those units 303 to perform the required conversion and/or buffering of C and V.

The effect of the above calculations needs to be considered. When unit 202 implements function 7, the effect is that for each Time Set 0 (Settlements Period) contained in the metered period, the consumer will be assumed to account for a similar fraction of V0. This is equivalent to the consumer having the consumption profile implicit in Cn(i). Where Cn(i) is derived from C0 data then Cn(i) will have an implied profile for each Time Set 0 period. In function 7 the consumer assumes (inherits) this profile such that the volume equals their metered data. Where Cn(i) can be expressed as a set of values for contained sub-periods (where Cn(i,j) is the value for the j-th sub-period), then applying function 7 is equivalent to the consumer having the consumption in the j-th sub-period defined by:

$$M \times Cn(i,j)/Cn(i) \tag{8}$$

where Cn(i) is the total value of On for the i-th period in Time Set n and Cn(i,j) is the value of C for the j-th contained sub-period.

The system can determine this consumption and use the price per unit to determine charges for periods (for example, Settlement Periods) contained in the metered period. This would be equivalent to using function 7. However, function 8 apportions M (the metered consumption) between contained sub-periods according to the profile of C. Determining charges using a price per unit and derived consumption enables the apportioning of M to sub-periods to be other than in accordance with the profile of C. This can be expressed as:

$$M \times f\{C1(i,j)/C1(i)\} \tag{9}$$

It would also be possible to simply apportion a defined percentage of M to each sub-period. Using function 9 it is possible to have a defined means of varying the profile of C.

A consequence of the proposed system is that consumers, during their metered periods, implicitly inherit a profile (for charge purposes) equivalent to that of C used to determine their charges. Thus refining C by subtracting consumers with short metered periods helps to ensure that the implied profile for any consumer is a good estimate, and reflection, of their behaviour. Means for achieving this is described later with reference to FIG. 19. However, during a consumer's metered period the degree to which they inherit the profile defined by C can be varied. Thus if a group of consumers (consisting of X consumers) all used the same pattern of metered periods, where a given period contains n sub-periods,, then the relative responsibility of individual consumers for consumption in individual sub-periods can be defined. One way to achieve this is to define weighting for each sub-period for each consumer where Wi is the weighting for the i-th sub-period for that consumer (weightings are unique for consumers or groups of consumers). Obviously the weightings for some consumers can be common. Ideally the total of the weightings for all consumers during a given sub-period should, for example, be 1.00 (or some other known value).

The charge for a consumer for the i-th sub-period can be defined as $$\{M \times Wi \times (Ci/Z)\} \times Vi/Ci$$

where $Z = \Sigma(M \times Wi)$. (The function is given in this form because in this form, the first term is the portion of M in a sub-period; the function can of course be simplified by cancelling Ci.) Z is the total of weighted metered data for the sub-period for all consumers, Ci is the value of C in the sub-period, and Ci/Z is the factor by which the total weighted consumption needs to be scaled to equal Ci in the sub-period. Therefore, the weighted consumption of a consumer (M×Wi for that consumer) can be multiplied by the scaling factor. Multiplying this by V/C for the sub-period then produces a charge.

This mechanism enables consumption, and hence a charge, to be determined during each Settlement period. This enables M for the metered period to be apportioned between contained Settlement periods in a manner other than in direct correlation to C (for the Settlement periods). The distribution of M to contained sub-periods (i) could be pre-defined (potentially with some time dependence), (ii) could be a combination of a consumer defined profile (or generic profile) and the Closure profile, or (iii) could relate to other consumers so as to ensure that at least some system parameters balance.

As stated, it is possible in the present system to group a number of units 303 within a unit 304 in order to share some common circuitry and/or logic. Unit 304 can also support units 303 associated with consumers having similar metered periods. Therefore, if C and V are provided to unit 304 for some pattern of periods, for example Time Set 0, then these could be converted as necessary to represent other periods, for example another Time Set corresponding to the metered periods of associated consumers.

Figure 16:
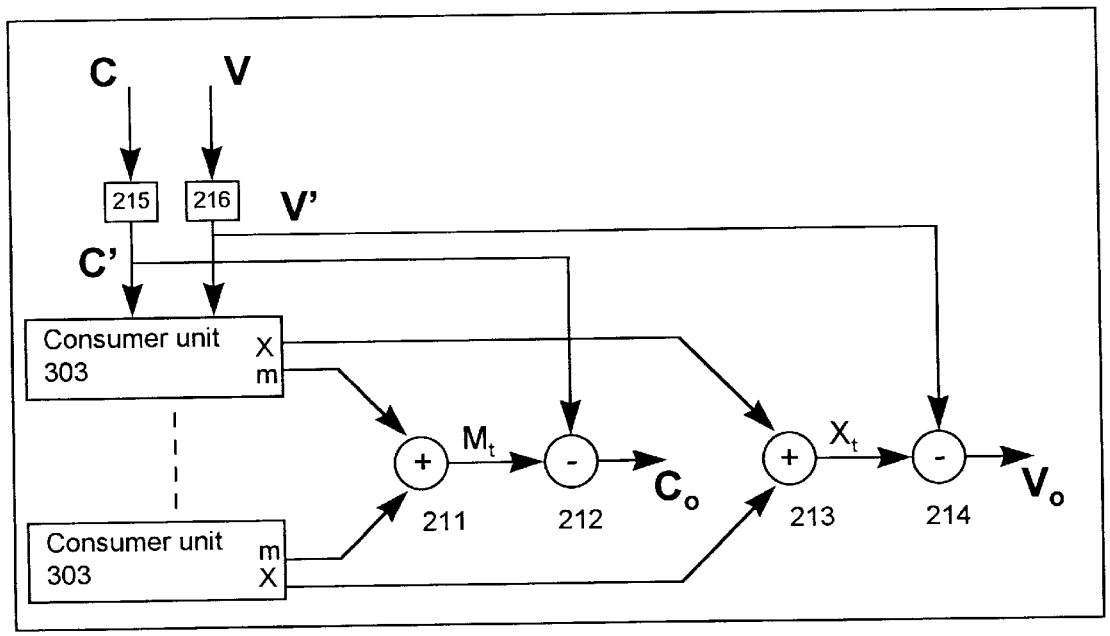
FIG. 16 shows a form of unit 304.

FIG. 16 shows an implementation of unit 304 as unit 304/1. C and V are provided to the unit as per a unit 303. They are then converted as necessary by units 215 and 216 respectively to provide C' and V'. C' and V' may in a given implementation include C and V—the inputs to unit 304 (or buffered versions thereof)—and values corresponding to the metered periods of consumers. These are then connected to a plurality of unit 303 and will therefore be sufficient for a unit 303 either to implement function 4 (based on producing a charge for associated metered periods) or function 7 (thereby producing a charge for sub-periods of metered periods).

Unit 304 also provides a consistent approach for all units 303 and they therefore all calculate outputs for either metered periods or defined sub-periods (preferably the periods of input V). This enables the outputs of all units 303 to represent the same periods; the charges and metered data can therefore easily be totaled, as performed in FIG. 16 by units 211 and 213. It is noted for this purpose that the metered data is obviously for metered periods and therefore it is likely that Mt will be produced for such periods. However, function 8 above provides a means to derive a value for consumption in sub-periods and therefore it is possible to produce Mt for sub-periods of the metered periods, notably the periods of the C input.

Unit 304 also includes means to produce C and V outputs (labelled Co and Vo) using units 212 and 214 respectively. Either of these can be expressed in terms of metered periods or any other convenient set of periods (such as the periods of the associated C or V input to unit 304).

Figure 17:
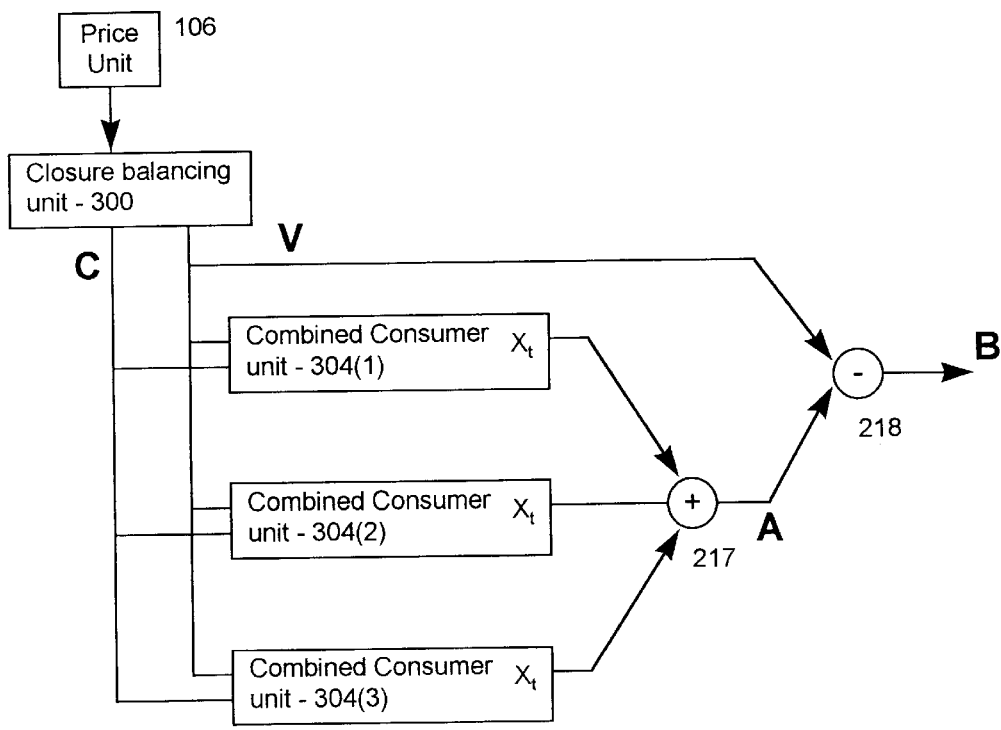
FIG. 17 shows a further form of the present system.

FIG. 17 shows a form of the present system. Unit 106 can be used to determine a price per period for electricity supplied to the associated Closure(s) for the Settlements system. This is fed to unit 300 which, using the metering at Closure inputs, determines C and V for suitable periods (for example for each Settlements Period). An alternative would be for the value of electricity supplied to given Closure inputs (and possibly the associated number of units) to be determined, possibly by another instance of the present system which is associated with the distribution network supplying Closure inputs, for each period.

Unit 300 provides C and V outputs which represent per period the total supplied electricity, in the example of electricity supply, and total value. C and V are then connected to a plurality of units 304 (and/or units 303). Each unit 304 can support a plurality of units 303, ideally where they have the same pattern of metered periods (use the same Time Set).

The units 303 (either connected directly to C and V from unit 300 or contained within a unit 304) can produce charge outputs for either Settlement Periods (ie the periods used for C and V from unit 300), their associated metered periods, or some other defined set of periods. The system can be implemented to support any of these options. For the purpose of explanation it is assumed that all unit 303 produce outputs for Settlement Periods. This will enable the outputs from all units 303 in a unit 304 to be totaled in the unit 304 and then the outputs of all units 304 to be totaled, as performed by unit 217 in FIG. 17. Also, the total charges A for a particular Settlements Period can be subtracted—as in the prior art system—from V (by unit 218) to produce B. The difference is that A is based upon charges derived from metered data corresponding to periods other than the Settlements Period.

If all units do not provide results using a common period, then results for equivalent periods can be totaled as appropriate and can be converted to longer periods, or accumulated over time, in order to provide overall results.

In the system shown in FIG. 17, the values of C and V for each unit 303, irrespective of the metered period used, are derived from the C and V outputs of unit 300. More specifically if the metering for a unit 303 used Time Set n for its metered periods, the Cn(i) and Vn(i) are the total of C and V for contained sub-periods.

A result of implementing the system as shown in FIG. 17, even if all consumers are included as A consumers, is that A, for a given Settlements Period, will in general not equal V, from unit 300, even if the estimate (L) for loss was accurate. However, charges, including charges for suppliers can be determined for Settlement Periods. In the present system, the calculated charges can be adjusted such that the total charges calculated (A) equals V from unit 300 (the total value supplied to the Closure). However, any adjustment also deals with any error in the estimate of loss (L) used in the function of metered data.

L is a constant defined to account for loss such that the total of M×L for all consumers equals C. This may not be possible in reality and L may be an estimate with the intention that ideally M×L for all consumers equals C. Potentially, the value of L for each consumer could be unique to that consumer. It may also be set such as to ensure that it either over- or under-estimates loss or encourages energy efficiency.

For each period, L could be defined either on a Closure basis or per consumer. Scaling consumer metered data by L (as above) enables L to be uniquely defined for each consumer. Alternatively L could be removed from the function implemented in unit 202 and the output of unit 201 (shown in FIG. 14) simply scaled by a defined value representing overall L. (It is assumed for convenience that the output of unit 201 represents the total electricity supplied into the Closure and the function implemented in unit 202 adjusts for loss.)

If all consumers are (i) included in settlements as A consumers and (ii) use an identical pattern of metered periods, (iii) function 5 is used to implement unit 202, and (iv) the estimate of loss (L) was accurate then B, the output of unit 105, would equal zero and therefore the total value (V) would be accurately accounted for by A, the output of un it 102. However, this is not true either if the estimate of loss is not accurate (which is likely) or if, in FIG. 17, consumers use different metered periods. Therefore each supplier charge could be scaled by (A+B)/A, or L could be re-adjusted and new charges determined, in order to achieve a system which financially balanced. If some form of adjustment is not made, in order to account for actual loss, then it must be decided who is responsible for any error in the estimate of loss (L) and hence the value B.

Figure 18:
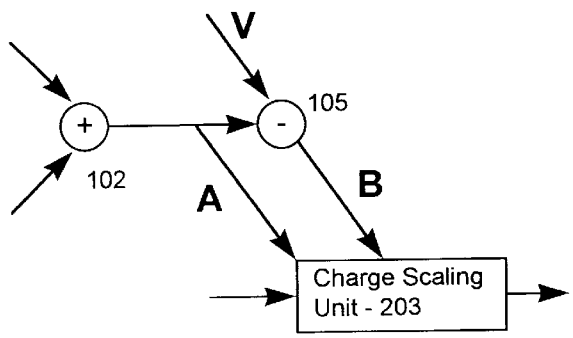
FIG. 18 shows means for adjustment for loss.

FIG. 18 shows means for adjustment for actual loss. Unit 203 implements the above function to scale supplier charges. (Unit 102 is fed with consumer charges.) A plurality of units 203 will be used, each being fed with a raw supplier charge determined for a particular supply company and producing an adjusted supplier charge. A unit 203 could also be used to scale A to determine the total charges for all companies, but this would simply produce V. In the present system each unit 203 can be integrated with the associated unit 107 used to determine the supplier charge. It is alternatively possible to scale individual charges, calculated by each unit 202, but this would increase the logic or circuitry required to implement the system, which may riot be justified. Alternatively the value of L, for a given period, (or some other constant) can be varied and charges re-calculated such that B is zero for the given period.

It should also be noted that the proposed method of adjustment can be applied to any period (not just Settlement Periods). If supplier charges A and B are determined for any period, then the circuit of FIG. 18 can be used to adjust charges.

The system as described so far allows, if all consumers are explicitly included, loss to be accurately accounted for and charges scaled to ensure a balanced system financially. If all consumers within a Closure are not explicitly included within Settlements, then B will represent the charge for all of those excluded and also the error in loss apportioned to A. The above means of adjusting charges shown in FIG. 18 can also he applied even if some consumers are excluded from Settlements (and hence included in B, the output of unit 105), if the desired value of B is known, predicted or estimated (as discussed below).

The system described so far also determines charges based upon the total consumption within a closure, rather than just the consumption of an individual consumer. It further determines the value for the electricity supplied to a Closure using different price mechanisms for each input point rather than treating all inputs together.

The present system can also be applied to Closures which, at least in part, represent the National Grid or part thereof. The present system can be applied using a Closure which represents the National Grid and therefore used to determine a charge, for a given period, for each Grid Supply Point.

The present system can also be implemented so that, if all consumers are included and the estimate of loss is accurate, B is zero without the need for adjustment. Hence the system inherently balances. However, in practice errors in the estimate for loss, minor timing differences between meters, recording accuracy, etc will mean that the system does not balance in reality but can still be adjusted to balance as just described.

Figure 19:
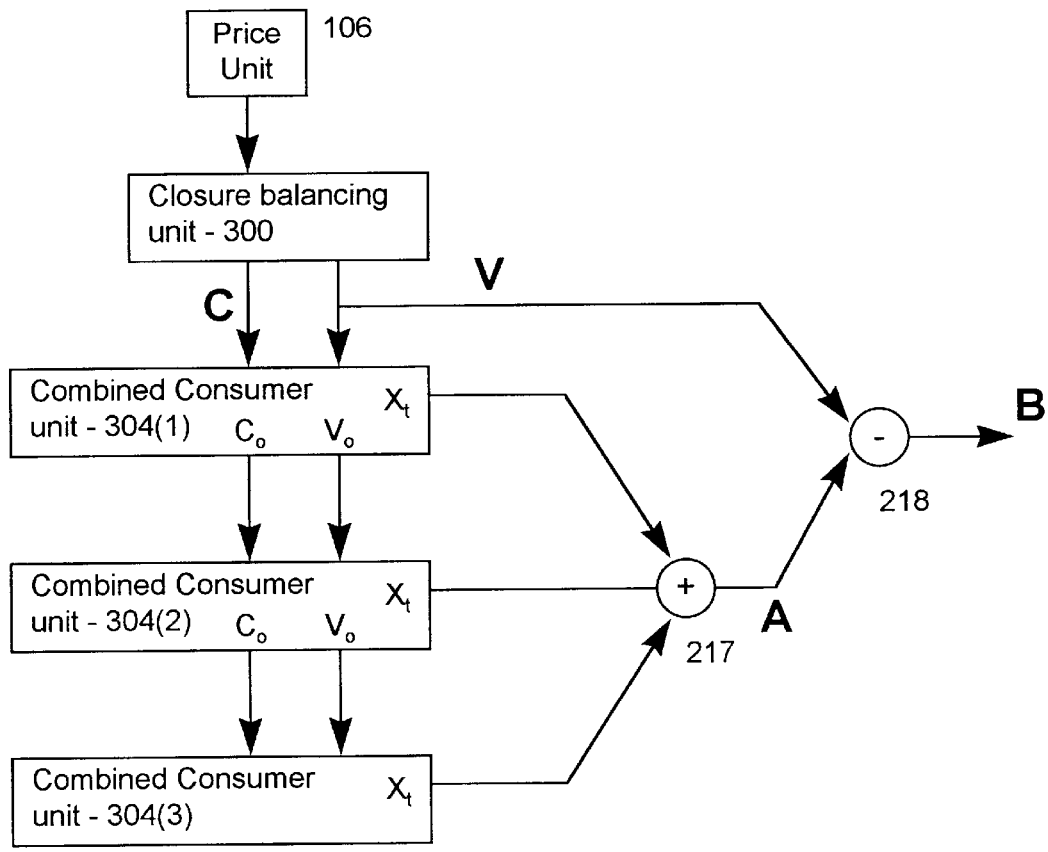
FIG. 19 shows a further form of the present system.

FIG. 19 shows a modified structure for the present system. FIG. 16 shows the preferred implementation of unit 304 and this includes the means to determine outputs for Co and Vo. These values equal, for each period, the input values of C and V respectively minus the total consumption and value apportioned to consumers supported within the unit 304. If the outputs are calculated, for example, for each Settlement Period, then Vo will be the input value V (for the Settlements Period) minus the charge determined by each unit 303 for that Settlements Period. This is referred to as the remaining value for that unit 304, and is the amount remaining from the input which is not accounted for by the calculations performed by that unit. Similarly Co is the remaining consumption from the input value (C) which is not accounted for by the metered data from contained unit 303. Co and Vo could alternatively be calculated for each metered period (or any other appropriate period).

The system in FIG. 19 includes a plurality of units 304. However, rather than the inputs being connected to C and V from unit 300, they are connected to the Co and Vo of another unit 304 and the units 304 are connected in a series in this manner. As previously detailed, the outputs, specifically the charge outputs X, can be produced for by appropriate means for any suitable period. Therefore data may generally be expressed throughout the system in terms of Time Set 0 periods (Settlement Periods). However, if the metered periods supported in each unit 304 are combinations of the metered periods in the prior unit 304, then the system will, excluding unavoidable errors, balance. Thus in FIG. 19,
unit 304(1) could support metering using Time Set 0 periods which could be 30 minute Settlement Periods, unit 304(2) could support metering using Time Set 1 periods which could be 2-hour periods, unit 304(2) could support metering using Time Set 2 periods which could be 4-hour periods, etc. This would then result in an accurate system but one which could still represent data internally (and in terms of its output) for a variety of periods including, but not limited, using Settlement Periods throughout.

FIGS. 17 and 19 show two forms of the system. In FIG. 17, the units 304 are all connected directly to unit 300, whereas in FIG. 19 they are connected in a chain from unit 304. A variety of hybrid forms are possible, in which the units 304 (or 303) form a tree structure connected to unit 300.

The circuits described determine charges for consumers. Alternatively, data for multiple consumers can be aggregated and charges calculated for the group of consulers. This could include determining charges, based upon the above circuits, for suppliers using aggregated metered data (or derived or estimated metered data) for associated consumers or subsets of consumers.

In order to adjust for errors such as that resulting from the estimation of network loss, the accuracy of meter measurement, etc, the circuit shown in FIG. 18 can be used.

One technical issue associated with the present system is that it requires metered data to be reliably provided on a regular basis. Preferably the present system additionally includes a mechanism which can estimate a charge for a consumer (or even a group of consumers) whilst their metered data, for a given period, is not available to the system. Initially the means for estimation is explained with the assumption that all consumers are included in Settlements as A consumers and all use the Settlements Period for metering.

For each consumer, a function E (which may be time dependent) can be defined. The simplest implementation will be E=1 for all consumers for all periods. However, E could be a constant (other than 1) specific to individual consumers, a function of time f(t), or derived from historical information (potentially also with some time dependence). If some consumers are not explicitly included in the Settlements system, a value of E needs to be defined representing all excluded consumers. Again this could be time dependent and/or could be derived from historical data.

Figure 20:
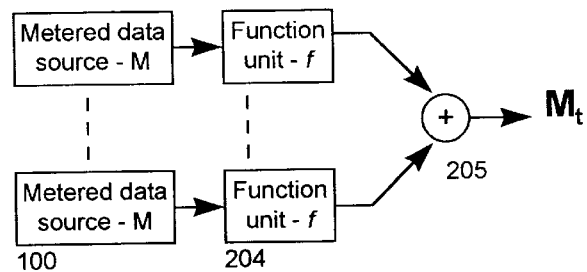
FIG. 20 shows circuitry for determining a quantity Mt.

FIG. 20 shows circuitry which enables, a given period the value Mt, the total metered consumption to be determined for those A consumers for which metered data is available. It is assumed in FIG. 20 that where a consumer's metered data is not available, then the output of the associated unit 100 will be seen as 0. If this isn't the case, a mechanism can be easily added to force such a condition. Unit 205 simply adds together metered data for all A consumers. The units 204 simply adjust the metered data for loss by calculating M×L. If L is defined for the Closure then the units 204 can be omitted, with unit 205 then directly adding the outputs of units 100 and its output being suitably scaled. Mt is therefore the total metered consumption scaled for loss. Mt does not need to be scaled for loss, so unit 204 is not required, if the output of unit 201 is scaled.

The circuitry of FIG. 20 implies that metered data is available for identical periods and therefore can be aggregated. Potentially this could be achieved, even if metered periods differ, by taking as the period the lowest common multiple of all metered periods. Alternatively, function 8 defines a mechanism to apportion metered data for subperiods which can be common to all consumers and therefore enable Mt to be produced.

Figure 21:
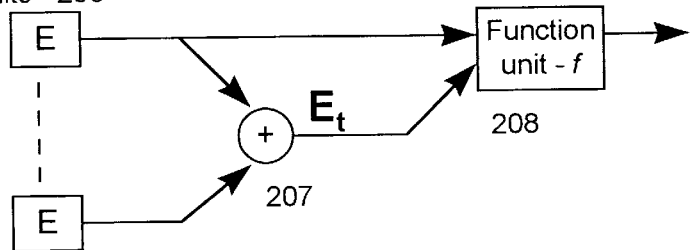
FIG. 21 shows an estimation mechanism for the system.

For a given period, Et will be the total, for all consumers whose metered data is not available (and therefore not included in Mt), of their values of E. It is therefore relatively easy for the present system to estimate a charge for a consumer. FIG. 21 shows an estimation mechanism for the system. For all consumers for which in a given period metered data is not available, units 206 provide values of E for the associated consumers. These are then totaled, for a given period, by unit 207. For each consumer (or potentially on a supplier basis) a unit 208 then determines a charge as a function of E for that consumer, and Et.

For an individual consumer, unit 208 can implement the function $$(E/Et) \times (C-Mt) \times V/C \qquad (10)$$

This determines the number of units of electricity not accounted for by consumers having metered data available (C−Mt) and the value that consumption represents (the remaining value, which is (C−Mt)×V/C). Then for the individual consumer, or group of consumers, the unit 208 determines a charge as a fraction of that remaining value in proportion to their value of E as a fraction of Et. The data used for this all relates to a particular period (although it need not be a Settlements Period).

Figure 22:
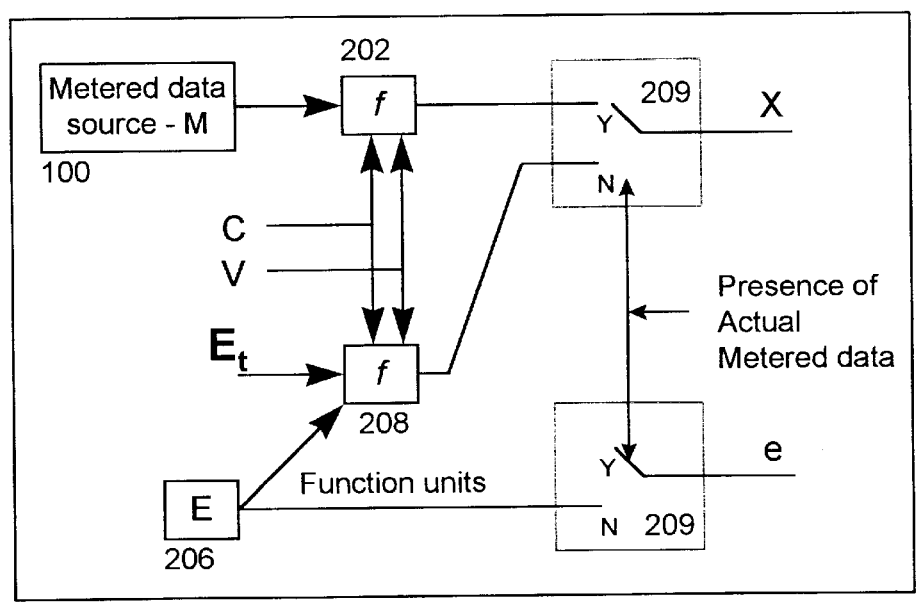
FIG. 22 shows a unit 303/2 which is a modification of unit 303.

The estimation mechanism can be incorporated into the present system. FIG. 22 shows a unit 303/2 (a modification of unit 303) which includes the circuitry to both generate the value E for the associated consumer for a given period (unit 206) and also, using an externally generated Et, calculate an estimated charge (unit 208). The units 206 and 208 are equivalent to those shown in FIG. 21.

Two switches or multiplexors 209 are controlled by a signal indicating whether, for the given period, metered data is available. The first switch determines the source of the charge associated with the particular consumer. The charge is either that derived from the metered data (using unit 202) or that using estimation (using unit 208). The second switch is used to select the value of E for the consumer as either 0 (if metered data is available) or that generated by unit 206 (if metered data is not available). Another, similarly controlled, switch could be used to output a value for the calculation of Mt if necessary (see the discussion above of forcing M to 0 in FIG. 20).

In FIG. 22, unit 208 uses C and V which are inputs to unit 303. Unit 208 can implement a function f(E,V) which uses E and V. This could simply involve taking the value of E as the fraction of the total value (V) which is to be apportioned to the associated consumer (thus E could represent the fraction of V which will be apportioned to the associated consumer). E could still be a constant, a function of time, based on historical information etc. Obviously such an implementation would not be intended to produce a balanced system financially (at least not while it contained estimates for a given period). However, that would not prevent the system being adjusted so that it balanced as explained above. If unit 208 implements a function f(E,V), that means that Et and Mt are not required. This therefore means that the circuitry necessary to produce these values is not required. The estimation mechanism could therefore be expressed as E×V where E is a fraction of V. Alternatively it could be $$(E \times V)/C \qquad (11)$$

where E represents a value of consumption. This is the same as function 4 with f(M) replaced by E. Alternatively Et could be replaced by Y to implement $$(E/Y) \times (C-Mt) \times V/C \qquad (12)$$

where Y can simply be a function of the total number of consumers not included in Mt. Using these alternatives, the estimation simply apportions a fraction of V, or the remaining value, to a consumer regardless of whether the total of all estimates in the period equals the remaining value (which the function originally proposed would do).

The circuitry of FIG. 22 could also be re-structured in various ways. For example, unit 208 could be modified to estimate a value of consumption rather than a charge (the modified unit being referred to as unit 208b). The estimated consumption produced by unit 208b can be defined as $$(E/Et) \times (C-Mt) \qquad (13)$$

Alternatively it can be an estimate of consumption based upon categorization of the consumer, historical data, prediction, or other means. A switch, similar to unit 209 and controlled by the signal indicating the presence of actual metered data, can then be used to select the output from either unit 100 or unit 208b as the source of consumption data for unit 202 which, as before, is used to determine a charge. Thus the unit 209 previously connected to the outputs of unit 202 and 208 can be removed and X (the charge for the associated consumer during a period) would be the output of unit 202.

Figure 23:
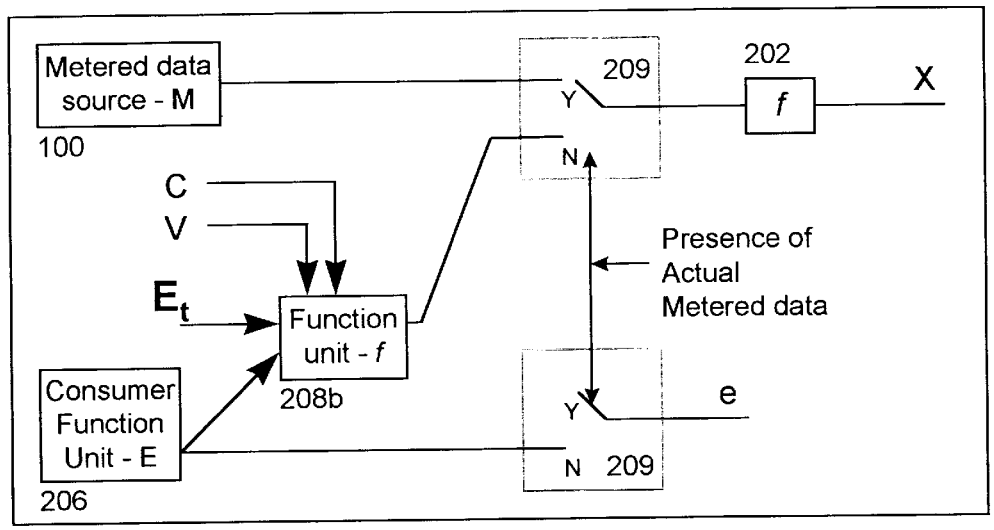
FIG. 23 shows a modification of unit 208*b*.

This arrangement is shown in FIG. 23. Unit 202 will operate as previously described. For the sake of clarity, the C and V inputs to unit 202 have been omitted. Further, unit 208b can be removed (as can the circuitry to produce Et) if E represents an estimate of actual consumption in the period and the output of unit 206 is fed directly to unit 209.

There are two outputs from unit 303/2. One represents the charge for the associated consumer, and will be determined using either the actual metered data for a given period or an estimate. The second output is a value for E (which may not be required if Et is not required in the system). A third output which may be produced as required is the value of M associated with the consumer, which can then be used by the system to determine Mt.

Figure 24:
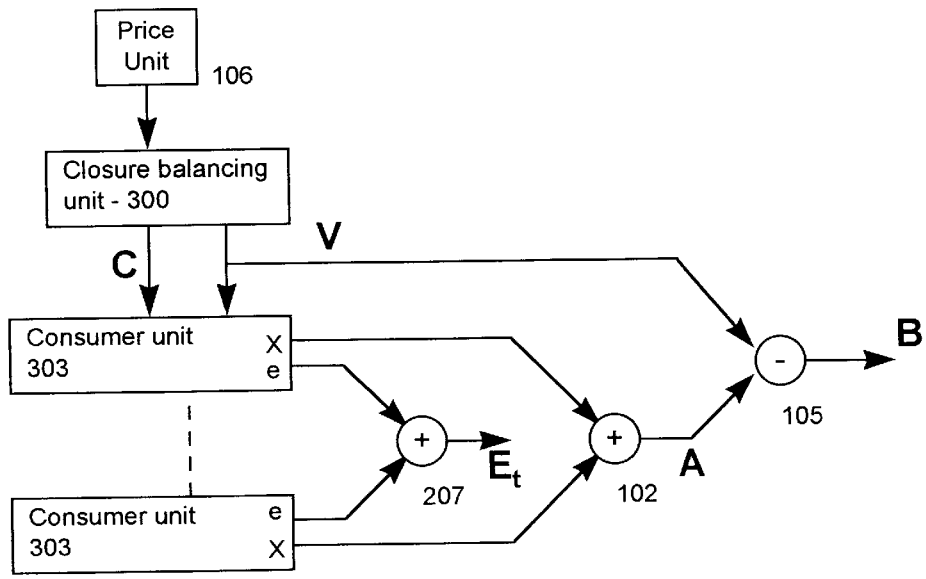
FIG. 24 shows a form of the system with a plurality of units 303/2.

FIG. 24 shows a form of the present system utilizing a plurality of units 303/2. The charges determined by each unit 303 are totaled by unit 102 to produce A (the total charge for all A consumers). The values of E from each unit 303/2 are totaled by unit 207 (as per FIG. 21) to produce Et. This is then feed back to each unit 303/2 (not shown) to enable the calculation of estimated charges. If units do not require Et to determine estimated charges then unit 207 is not required.

Figure 25:
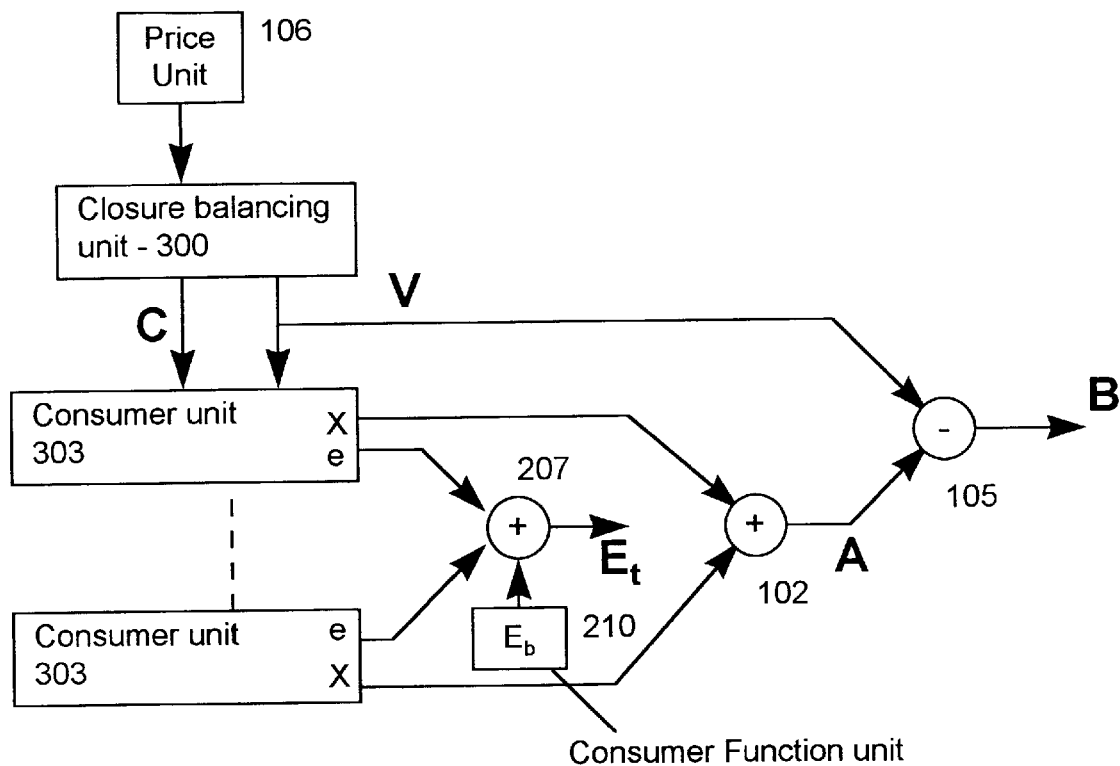
FIG. 25 shows a form of the system with some B consumers.

In the FIG. 24 system it is assumed that, in order for the estimation mechanism to operate properly, all consumers are included in Settlements as A consumers. FIG. 25 shows a modified system where some consumers (or consumption points) are excluded from Settlements and therefore collectively accounted for by the value of B. In order for the estimation of charges for A consumers to properly operate, a value Eb, representing E for all B consumers for a given period, needs to be generated. This is performed by unit 210.

Unit 210 operates in a similar manner to the unit 206 used for individual consumers. For a given period it generates a value for Eb which represents all B consumers (all consumers not directly represented in the system). The value of Eb could simply be the number of B consumers (equivalent to E equaling (or on average equaling) 1 for each individual consumer). Alternatively Eb could equate to a constant other than 1 per consumer, could be time dependent, or could be derived from historical information.

In generating E for consumers, either individually or for groups, (i) constants can be used (for example E=1), (ii) a time dependent function can be defined which reflects researched, predicted, or prior consumption, (iii) a function can be defined as a percentage of the remaining value (C or V) associated with the consumer(s) or (iv) a function can be defined based upon other factors such as climatic conditions, daylight hours, etc.

In the FIG. 25 system, estimation can be performed even though some consumers are excluded from direct representation in the Settlements system. B then represents the charge associated with such consumers and Eb is used as the value of E for such consumers for estimation purposes. If function 10 is used for estimating charges for consumers, it is obvious that the charge which would be apportioned to all B consumers (using Eb) equals that determined by unit 105 and labelled B. This means that B consumers could be included in settlements and represented as a single A consumer without affect to the system. However, in such circumstances, their consumption will always be an estimate, based on Eb. Despite this the system can still operate and can be adjusted to balance as previously described with reference to FIG. 18.

In the present system the method of estimation, or the function implemented for estimation, can vary from consumer to consumer depending upon implementation, the type of consumer, their demand, etc. Thus function 10 could be used for some whereas others use the FIG. 23 system (possibly removing unit 208b and having E as an estimate of actual consumption for each period).

An implicit assumption in the estimation technique discussed above is that all A consumers use Settlement Periods as their metered periods. Clearly for a Settlements Period it is of no relevance to the estimation whether the missing data is for the Settlements Period or a longer period. Thus for Settlements Periods the above estimation mechanism can be applied for each Settlements Period to all consumers irrespective of their metered periods. If consumption needs to be estimated for a Settlements Period where some metered data is available for specific consumers for longer periods encompassing the particular Settlements Period then, as discussed above, it is possible to apportion a value of consumption to periods (Settlement Periods) contained in the metered period. Function 8 enables this to be achieved. Therefore consumption in a Settlements Period can be calculated and this can be used in calculating Mt.

Where estimation is required for a period longer than the Settlements Period (or Time Set 0 period if different), then estimates for contained Settlement Periods can be totaled to provide an estimate for the longer period. Alternatively the above methods for estimation can be equally applied to any period. If some consumers have metered data available for shorter periods then, if necessary for the estimation process, this metered data (or a combination of metered data and estimates) can be totaled for the required period to provide M for such consumers for the period, and this can, if required, then be used to calculate Mt. If other consumers have metered data for longer periods, then either this can be ignored and a value for E generated for those consumers or their metered data can be apportioned to shorter periods, including the period for which estimation is required. The above techniques can thus be applied to all consumers irrespective of their metered periods and can estimate consumption or charges for metered periods, sub-periods of metered periods or any other appropriate pattern of periods.

As previously discussed, there are a variety of ways that the proposed system could be implemented and could operate. Potentially, an external system could collate (and archive) data and use the present system to perform the desired calculations. Alternatively, the present system could contain sufficient storage and circuitry to be self contained. The present system includes the means to perform estimation when metered data is not available. Following the end of a period it is possible that metered data for some, but not all, consumers is retrieved and available to the system. Estimation, as described above, can then be used for those without metered data.

Potentially, the metered data which is not immediately available may only become available in stages. The system can (i) wait until all missing metered data for a period is retrieved before replacing estimated consumption and/or charges, (ii) calculate actual charges for individuals whenever their metered data becomes available, (iii) perform calculations on a periodic basis for consumers for which data has become available, or (iv) wait until a number of consumers have metered data for processing. When metered data for a period is processed to determine a charge based upon metered data, rather than an estimate, there may still be other estimated charges remaining for the period (associated with other consumers). Either the previous estimates for these consumers can be kept or the estimated charges, or at least some of them, can also be recalculated using the revised value of Et, Mt or other parameters as required.

As discussed above, the system can be adjusted such that it balances (B=0). To implement this, the function:

$$(A+B)/B \quad (14)$$

can be used to scale charges. This assumes that all charges are scaled equally, and it is suited to being applied to scaling supplier charges rather than individual consumer charges. Where the estimation mechanism used does not seek to simply apportion the remaining value, and hence result in B (the output of unit 105) being 0, the adjustment mechanism can be applied only to estimated charges or to estimated charges in different proportion to non-estimated charges. Also, this can be implemented in a modified unit 202.

Assuming all charges are determined, for example, for Settlement Periods (even where the metered period is longer), then it is possible to determine the total of all estimated charges (referred to as Z). In FIG. 22 and FIG. 23 the charge output X can additionally be fed to a switch (similar to unit 209) the output of which is 0 if metered data is available or X if not. The total of all such values would equal the total estimated charges for the period (ie Z). Alternatively Z can be calculated using Mt if the method of determining charges is known for all consumers.

If only estimated charges are to be adjusted then an estimated charge can be scaled using $$(Z+B)/Z \quad (15)$$

As mentioned, an alternative is that estimated and non-estimated charges are both adjusted but in different ratios. Estimated charges could be adjusted using:

$$\{Z+f(Z/A) \times B\}/Z \quad (16)$$

and non-estimated charges by:

$$\{A-Z+(1-f(Z/A)) \times B\}/(A-Z) \quad (17)$$

where the function f(Z/A) produces a value between 0 and 1. f(Z/A)×B produces a portion of B which, in function 16, is then apportioned between estimated charges. The remaining portion of B is then apportioned between non-estimated charges using Function 17. If f(Z/A) was simply Z/A then the adjustments would be similar for estimated and non-estimated. Modifying the function (for example taking the square, or the square-root, of Z/A) will affect the distribution of adjustments.

Charges can also be adjusted by other means. In FIG. 19 each unit 304 is daisy-chained from the previous unit. This means that the metered periods supported by each unit 304 are derived from the periods used to express the previous unit's output data. If loss is correctly accounted for (in the estimate of loss L) and all consumers included as A consumers (or B consumers accurately estimated and included in the system), then the system balances and A will equal V and therefore B, the output of unit 218, will be 0. If the loss estimate L is inaccurate then B will equal the corresponding magnitude of this error applied to the overall consumption. This could be adjusted for, or charges scaled, as previously described.

Also, if the estimate for loss over-estimates actual loss, then Vo and Co of a unit 304 will contain an error equal to the error in the estimate of loss for those consumers already extracted in order to produce Vo and Co (ie those consumers supported by that unit 304 and prior units 304 used to produce the C and V inputs to that particular unit). This will also be true in the configuration of system shown in FIG. 17 where Vo and Co from all unit 304 could be added together (if provided for, or converted to, similar periods), and these totals will contain an error equal to the aggregate error in charges for associated consumers.

Vo and Co could therefore be used, within a system, to re-adjust charges. As an example, in FIG. 19 if the Vo or Co outputs of a unit 304 became negative it could be assumed that an error at least equal to the value of Vo or Co existed, and thus existing charges can be adjusted to make Vo and Co at least 0.

During a given period, Vt can be defined as the total value determined by unit 300. If, during the period represented by Vt, we have determined a number of charges for consumers where the total of all consumer charges is Vc, then the value Vo will be $$Vo = Vt - Vc. \quad (18)$$

We can make an adjustment to a charge Vx for the same period using the function $$Vx \times Vt / (Vt - Vo) \quad (19)$$

If all charges are adjusted using this function then the total will equal Vt.

The present system has been described as a system where charges and other information is determined for certain periods. Depending upon the implementation, results can be produced for metered periods, Settlement Periods, or any other pattern of periods. Where a variety of metered periods are supported, then it may be necessary to provide means for buffering or storing data within units.

The system can be extended to include management of payments for charges and also to perform this on an ongoing basis.

Consider initially a single consumer where the outstanding balance is 0. After one Settlements period (or metered period), a charge can be determined or estimated for the consumer. The amount payable on behalf of that consumer after one period is therefore the charge for that period. After a second period a charge can be determined, or estimated, for that second period. Assuming that no payment has been made, the total payable is then the sum of the charges for each of the previous periods. Extending this, the amount payable at any point in time is the sum of all charges apportioned to that consumer minus the sum of all payments on behalf of the consumer. This same approach would also apply to a supplier rather than a consumer. Thus the amount payable by a supplier at any point in time is the total of all charges apportioned to the supplier, or consumers for which the supplier is responsible, minus all payments made by the supplier.

Figure 26:
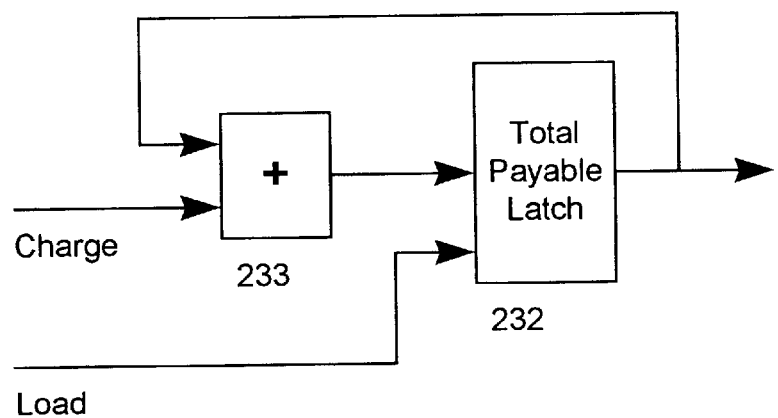
FIG. 26 shows charge accumulation means.

FIG. 26 shows means for accumulating charges for a given consumer or supplier. Unit 232 is a latch which produces the total amount payable at its output. The value of new charges is fed to unit 233, which adds the new charge to the existing total. A signal indicating the validity of a new charge then causes the output of unit 233 to be loaded (latched) into unit 232. Either additional circuitry can be provided to support payments or payments can be represented as negative charges which cause the value in unit 232 to be reduced by the payment value. To support payments separately would require a unit capable of subtracting the payment from the existing total and then causing the new total to be loaded into unit 232. Obviously this functionality can be integrated with unit 233. Alternatively, charges and payments can be handled completely separately. Payments can then be accumulated by a separate circuit similar to that of FIG. 26. The difference between the output of the accumulated charges and the output, of accumulated payment is then the current balance.

Assuming a combined circuit for charges and payments, then the output of unit 232 will, at any instant, provide the current amount payable for the associated consumer or supplier. However, some of the individual charges that the outstanding balance represents may be estimates or may be subject to adjustment or revision. The system may therefore have a means to support such adjustments. When an adjustment is made, the new charge may be greater than or less than the original (or previous) charge. The difference could be simply fed to unit 233 as a new charge and the current balance therefore adjusted. In order to achieve this, the value of the previous charge needs to be stored or a means must be available to determine it. Potentially this could be achieved externally to the present system but it is preferred that the system includes a means to store data for periods while either an actual charge has not be determined or while the charge is subject to revision or adjustment.

Figure 27:
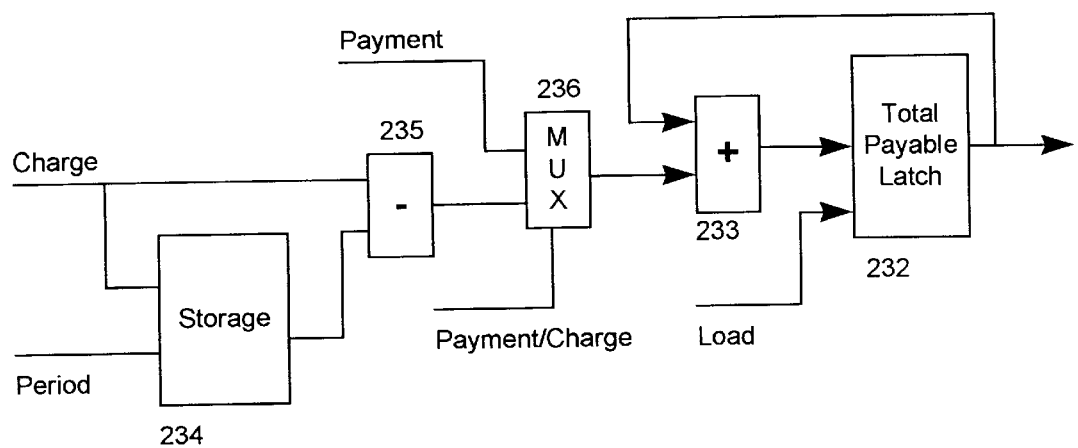
FIG. 27 shows a modified circuit including means for storing charge values.

FIG. 27 shows a modified circuit including a means for storing charge values. A storage unit 234 is used to store the charge previously apportioned for a period, together with an identifier for the period. When a new charge is determined, it is provided with a period identifier or stored in such a way that the period can be derived. If unit 234 contains an entry for the period, then the difference between the previous charge, stored in unit 234, and the new charge is determined by unit 235. Unit 236 is a multiplexor and is used to select either the difference in charge (the output of unit 235) or payment information, under control of a signal indicating whether a payment or a charge is involved.

The output of unit 236 is therefore the current adjustment to the amount owed, and is fed to unit 233, which adds it to the amount owed. Obviously the output of unit 236 can be positive or negative. Also, control logic (not shown) is required to sequence and manage payments and charges (or the circuit shown in FIG. 27 can be designed to support simultaneous updates). Simultaneous payment and charges could be supported by modifying unit 233 to implement $$Current\ amount - Payment + New\ charge. \quad (20)$$

This will then remove the need for unit 236.

The new amount owed (output of unit 233) is stored in latch unit 232. When a charge is determined for a given period, then if unit 234 does not contain an entry for the period the output of unit 234 should be 0 or unit 235 should be designed to simply output the new charge without modification.

The charges stored by unit 234 can be simply all previous charges, charges for the most recent periods, charges which have been estimated, charges likely to be adjusted, or some combination of these.

As mentioned previously, charges and payments can be accumulated separately and the difference will be the current balance owing. Similarly it is possible to accumulate the total value of electricity supplied into associated Closure(s). This then permits a further means of adjusting the system. If all consumers are included in settlements (either directly as A consumers or using some form of estimation) then an adjustment can be made. If the total accumulated charge is J and the total value of supplied electricity is K, then a charge can be adjusted by multiplying it by K/J. This is similar to the previous methods described for adjusting the system, and can similarly be modified to adjust estimated and non-estimated charge to differing degrees. Ideally the total adjustment obviously equals K−J. As previously described, it is possible to apportion this amount differently between estimated and non-estimated charges.

Considering the circuit necessary to both determine charges and produce the ongoing amount owed, then a combined circuit can be used. Some or all of the information required in the above functions can be stored per period in unit 234. The information stored in unit 234 could then be represented as a table as shown below

| Period | M | C | V | X |
|--------|---|---|---|---|
| a      |   |   |   |   |
| b      |   |   |   |   |
| c      |   |   |   |   |

Each entry (a,b, c, etc) in unit 234 is capable of storing information associated with a period, and may or may not include a period identifier (there is no need to store an identifier if it can be derived in some way—such as being derived from the storage location used). Given that unit 234 contains sufficient information to reproduce the associated charge, then there is also no need to explicitly store the calculated charge X, although it may be desirable to do so in a particular implementation.

In the above table, storage is provided for M (metered data). This could be used to store actual metered data or could be used to record an estimate in the absence of actual data. Alternatively, separate storage could be allocated for actual and estimated values and/or flags used to indicate the presence of one or both.

A single unit could be designed to support a number of consumers where the means to determine their associated charges are the same. In such a situation their aggregated metered data (and/or estimated consumption or combination thereof) needs to be calculated and can be used to determine charge.

When a charge is determined based upon actual metered data and added to the ongoing amount owed, then, assuming the charge is not going to be adjusted, any associated entry in unit 234 can be removed and the entry made available for other purposes. However, this is not necessary if unit 234 is sufficient to store all historical data.

Data such as C and V will generally be common to several consumers. It may therefore be practical in suitable circumstances to share at least part of unit 234 between several consumers. Thus the storage of some or all information can be in a unit (or sub-unit) common to multiple consumers, so decreasing the overall amount of storage required. It may also be desirable to use external storage or a backup facility for data. As stated above, a single unit can be used to support multiple consumers with aggregate (or common) data being used for calculations.

Having storage of data on a per period basis means that the associated information for particular periods, can be obtained, or determined, in any order or at least with greater independence.

Unit 234 can therefore be used to store a variety of information relevant to determining charges for a consumer (s). This information may become available at different times, and all of the information relating to an individual period may not be obtained simultaneously. Also, some information may be subsequently revised or adjusted. It is logical in such circumstances to combine unit 234, unit 235, and the means (unit 202) to determine charge. Unit 234 will therefore be used to gather information. Once sufficient information is present to determine a charge for a given period, then the charge can be calculated and output. This therefore replaces unit 202 previously used to determine charges. If any data relating to a period changes or new data is obtained, allowing a revised charge to be determined, then a new charge can be calculated. The difference between the new charge and the previously calculated charge can then be output to update the amount owed and the new charge stored in unit 234 (if appropriate).

Figure 28:
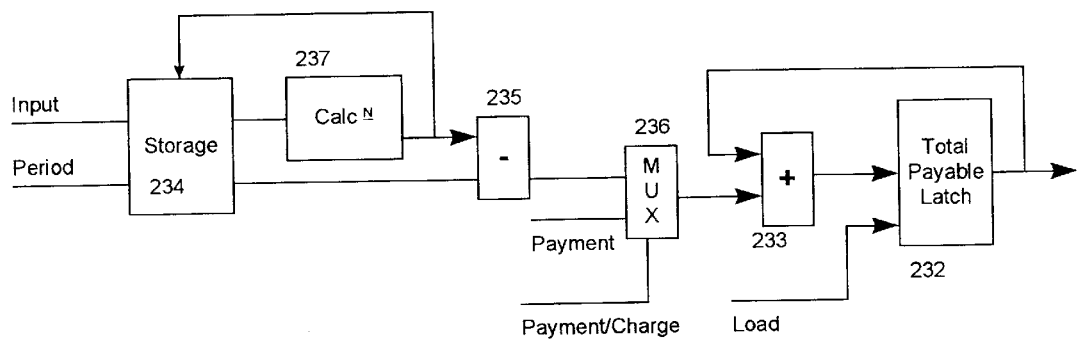
FIG. 28 shows an extension to the FIG. 27 system.

FIG. 28 shows an extension to the FIG. 27 system to include the features described. Input data (including metered data) and period information (which may be derived within the circuit) are fed to storage unit 234. Unit 234 can accept various information relating to either metered periods or some defined period used to communicate or store data (which is a sub-period of the metered period). When unit 234 has sufficient information relating to a particular period to determine a charge for the period (either estimated or actual), data is passed to a charge calculation unit 237 which determines a charge for the period. This charge may then be loaded back into unit 234 for future reference. If a charge had previously been determined, this is also passed from unit 234 prior to being deleted or overwritten. Unit 235 determines the difference between the new charge and any previously calculated charge. This is then used to update the amount owed, and the remainder of the circuit is similar to that shown in FIG. 27.

Charges can be accumulated at any stage within the system, and it is reasonable to do so at both the consumer and supplier level as well as for the overall network. Accumulating values at one point does not prevent values also being accumulated at another point.

Figure 29:
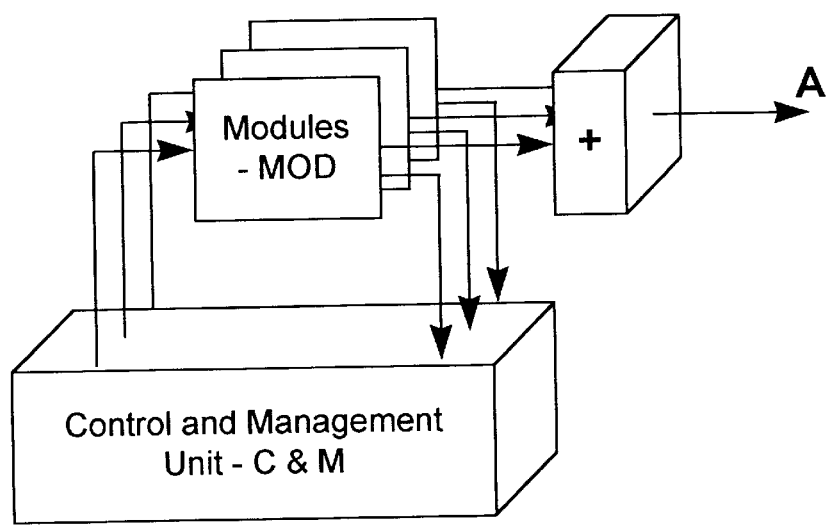
FIG. 29 shows one form of a complete system.

FIG. 29 shows one form of a complete system, comprising a control and management unit C & M, a set of modules MOD, and an output unit fed by the modules. It is based on a module to support a single consumer (node), where similar modules may be used for each consumer. The modules are ideally of the form shown in FIG. 28, with the addition of a control means to manage the operation of the unit and also other means to generate values for E (used in estimating consumption) and other outputs. There are various mechanism to control and interface to the module and in order to link them together. These are implementation issues and do not affect the overall behaviour of the system.

A plurality of modules can be organized to support consumers either individually or in groups. Each module can provide the total accumulated charge apportioned to the associated consumer(s) and these charges can be totaled to produce the total charge for all consumers. The charge data from individual modules may also be connected to supplier units used to determine the charges for suppliers. If the amount previously paid by a supplier is subtracted from the total supplier charge then the result is the amount currently payable by the supplier.

The modules preferably have a number of inputs and outputs connected to a control and management unit. This control unit can therefore generate inputs to the modules and read outputs from them.

The system is described as though each module is self-contained. However, some functionality and storage within a module may be common to other modules and there is therefore significant opportunity to share or combine such elements. There is also significant opportunity to extract aspects of the control and management unit as separate units or as logic capable of enabling several functions to be performed simultaneously.

Within a module, storage can be provided for information relating to Settlement periods and or metered periods. Also the module will contain circuitry (which may be programmable) to determine the metered periods used by the associated consumer.

A period identifier (or signal derived from a period identifier) can be used as an input to each module to provide an enable. Obviously a requirement is that the metered periods for a consumer represent all time. The metered periods will be arranged in an order, or pattern, to represent time; however, individual periods need not represent continuous time. A number of such patterns of metered periods may be defined and supported within a system where each consumer uses one pattern. It is also desirable to define an ordering for the patterns in the system, as this helps to ensure that the system balances (assuming an accurate estimate of loss). Thus, for example, pattern 1 may be a pattern consisting of Settlement periods, pattern 2 containing 2-hourly periods, pattern 3 containing a pattern of 10 periods repeating weekly, etc. A module should be able to determine whether the period identifier input relates to its pattern of periods, a pattern lower in the order, or a pattern higher in the order (or separate signals should be provided for this purpose). This ordered structure is equivalent to that in FIG. 19 where each unit 304 is used to support a pattern of metered periods (Time Set) and they are connected in a defined order.

If an order is not defined for patterns then all modules can simply use C and V relating to the whole Closure to determine charges rather than a version of C and V from which the consumption and charges of some consumers have been subtracted. This will equate to a structure similar to that outlined in FIG. 17. Having an ordered sequence of patterns for metered periods is similar to the structure presented in FIG. 19, where the value of C and V for each pattern is derived from C and V from the previous pattern having subtracted associated consumers. It may therefore be necessary to group modules in a similar fashion to the way in which units 303 are grouped in unit 304. This enables, with suitable control logic, Co and Vo to be determined and which control means can then feed the modules in the next group.

FIG. 29 illustrates the module based system. Individual modules are similar to those in FIG. 28 and the outputs of these can be totaled as necessary. A common control and management unit then controls input data and the selection of periods.

The system as described so far calculates charges for periods which may be of extended duration. The general formula for determining a charge is:

$$f(M) \times V/C$$

Various means to estimate consumption have also been defined. FIG. 28 shows a form of the system. This system can be applied to situations where the metered periods, or periods for which charges are to be determined, are of extended duration and it may be desirable to perform one or more interim charge calculations.

During a period it is possible, using the mechanisms described above, to estimate consumption for the currently elapsed portion of a period. C and V can also be determined for the elapsed portion of a period (particularly if the elapsed portion represents an integral number of Settlement Periods or Time Set 0 periods). A charge can therefore be calculated using current C and V and estimated consumption for the elapsed portion of a period. If the metered period, for example, spans a week, then daily charge calculations can be made based upon current estimates for the elapsed portion of the period and current C and V.

Using the circuit in FIG. 28 as an example, the values stored in unit 234 for the period in question can be updated to reflect the current values or estimates. There is no limit to the number of times period information can be revised and the charge re-calculated. If this is done, for example, on a daily basis, the difference between the new charge and the previous value can be added to the amount owed. On, or following, the last day, actual metered data may be available. This will mean that the charge calculated is an actual charge. The difference between this and the estimated charge for the previous day will be added to the amount owed. In so doing it implicitly corrects any errors in the prior estimates.

The present system described so far provides a means for determining charges based upon either metered data or estimates. The present system can be applied to one or more Closures which can include, at least in part, the National Grid (the distribution network to which generation stations are predominantly connected).

The known system is used to determine a charge for each supplier. A separate system, referred to as the Pool, then ensures that individual generation companies are paid for the electricity they generated (or were scheduled to generate).

The present system allows the determination of the value of electricity, which can include costs unique to each generation station and/or which are, for a given period, fixed (not dependent upon the number of units generated). The costs could also be non-linear with respect to the number of units generated. This means that costs for scheduling, but not utilizing, generation capacity, and other such costs (such as are associated with network constraints or operating systems, including settlements) can be included in the per period value apportioned within settlements.

It is desirable that the settlements system further includes means to determine the charges to individual generation companies or the amounts payable by each supplier (or for each consumer) to individual generation companies. To achieve this, a list (the generation list) can be maintained for each node (input or output to a Closure). This list will contain a fractional value G for each generation company associated with that node which represents, for a given period, their responsibility for the electricity supplied via that node.

The generation list could simply be a list of fractions (which should total 1) where all possible generators are included in a known order. Therefore each generator would be represented in all generation lists at a known location in the list. Alternatively the generation list can provide an identifier for the generation company and associated fraction. Each entry in the list would therefore contain two values (identifier and fraction, G). Where the present system is applied to Closures which have generation stations directly connected, then for those nodes the generation list will generally contain one entry for 1 since individual generation stations are normally operated by a single company (which could be a joint venture company).

For a Settlements Period, a generation list can be calculated for a Closure. During the period, the total value of electricity supplied into the Closure is V0. For an input to the Closure, a generator will account for an amount of the electricity supplied to that input S defined by G×Vx (the value of electricity supplied to the Closure via that input in the period). For the Closure the value G in the period for a particular generation company will be the total of S for that generator for all Closure inputs divided by V0.

Once the generation list is calculated for the Closure for a Settlements Period, then all output nodes (consumers) in the Closure can adopt the generation list. Therefore if a charge for a consumer (output node) in a particular Settlements Period is X then the amount owed to each generator will be X multiplied by the generator's value of G in the generation list.

If charges for a consumer or a supplier are determined using periods longer than the Settlements Period, then a generation list can be defined for the longer periods. To calculated charges for extended periods, C and V are converted to the extended periods. Each time a new set of values for C and V are generated, an associated generation list can be calculated. For example, consider the conversion of C0 and V0 to C1 and VI where Time Set 0 represents Settlement Periods and Time Set 1 some set of longer periods. For a particular generator, the value supplied for each Time Set 0 period can be determined as V0 multiplied by the generator's value of G for the period. The value of supplied electricity (for the generator) can be totaled for a Time Set 1 period. The value G for the generator in the Time Set 1 generation list is then the total supplied by the generator in a period divided by V1 for the period.

Where one Closure (K1) has an output node which is an input to another Closure (K2), then the generation list for K1 (or the individual node) can be the input generation list to the node in K2.

In summary, there is provided an apparatus associated with a public electricity distribution network to determine charges for the supplied electricity where the period during which consumption is measured (the metered period) is longer than the period used for settling the price or value of the electricity (the settlements period) and where the charge can be determined for either the metered period or the settlements period. The apparatus further provides means for adjusting charges such that the total charges equals the total owed or that total minus a defined amount. Means are also provided whereby the apparatus does not require metered data from all consumers connected to the network. The apparatus also provides means for determining the value of the supplied electricity where a plurality of generation sites exist each of which is separately valued.

I claim:

1. A method of determining a charge in respect to consumption of electricity supplied from an electricity distribution network and priced in successive sub-periods,
the network incorporating a closure having one or more input supply connections all of which are metered and output connections including at least one metered output,
the method comprising:
using information derived from the metered inputs to the closure to determine a profile indicating the variation in the quantity of electricity supplied to the closure over the sub-periods;
metering each metered output to determine the quantity of electricity taken by that output over a metered period, longer than each sub-period, for that output;
determining an apportionment of metered consumption between the sub-periods in dependence on the profile; and
determining a charge for the consumption in dependence on the quantities of metered consumption and the apportionment.

2. A method according to claim 1 wherein the charge determining step comprises forming a single aggregate charge for the supply to a plurality of the closure outputs.

3. A method according to claim 1 wherein the charge determining step includes apportioning quantities of the metered consumption for a plurality of the metered outputs to determine an apportioned quantity of the consumption in the sub-periods for the aggregate of the metered outputs.

4. A method according to claim 1 wherein the profile is dependent on the quantity of electricity supplied to the closure over the sub-periods.

5. A method according to claim 1 wherein the profile is dependent on the quantity of electricity supplied to the closure over the sub-periods minus the quantity of consumption for a least some of the outputs of the closure.

6. A method according to claim 1 wherein the profile is additionally dependent on a predetermined weighting for each sub-period.

7. A method according to claim 1 wherein the charging step includes adjusting electricity distribution losses in the closure.

8. A method according to claim 1 further including determining one or more interim consumption charges before consumption data for the metered output becomes available, and subsequently modifying the interim consumption charges by reference to the actual consumption.

9. A method according to claim 1 wherein the closure comprises a national electricity transmission network.

10. a method according to claim 1 wherein the charge determining step includes adjusting the charges such that the total of all charges in respect of all electricity supplied by the closure equals the cost of that electricity.

11. A method according to claim 10 wherein the adjustment is a scalar adjustment.

12. A method according to claim 1 wherein the charge determining step includes adjusting the charges such that the total of all charges in respect of all electricity supplied by the closure differs from the cost of that electricity by a desired amount.

13. A method according to claim 12 wherein the adjustment is a scalar adjustment.

14. A method according to claim 1 wherein the charge determining step for a sub-period comprises dividing a collective value of electricity supplied during the sub-period, said collective value representing the value of electricity consumed by a group of closure outputs, by the collective quantity of electricity supplied to said group of closure outputs during the metered period of the metered output.

15. A method according to claim 14 wherein the group of closure outputs includes all of the closure outputs, the collective value of electricity supplied during the sub-period being determined by aggregating the value of all electricity supplied to the closure during the sub-period, and the collective quantity of electricity supplied being determined by aggregating the quantity of electricity supplied to the closure.

16. A method according to claim 14 wherein:

the collective value of electricity supplied during the sub-period is determined by aggregating the value of all electricity supplied to the closure during the sub-period and subtracting the value of electricity supplied to those closure outputs not within said group of outputs, and determining the collective quantity of electricity supplied by aggregating the quantity of electricity supplied to the closure and subtracting the consumption of those closure outputs not within said group of outputs.

17. A method according to claim 1 wherein the closure is supplied by a plurality of generating companies, and further including the step of determining, with respect to charges determined for electricity supplied by the closure to the outputs of the closure, a ratio in which those charges are partitioned between the generating companies.

18. A method according to claim 17 wherein the ratio is determined with respect to an input point.

19. A method according to claim 17 wherein the ratio is determined with respect to all inputs to the closure.

20. A method according to claim 17 wherein the ratio is determined with respect to one or more outputs of the closure.

21. A method according to claim 1 wherein the charge determining step includes apportioning the quantity of metered consumption for each metered output to determine an apportioned quantity of the consumption in a sub-period and to determine a charge for the sub-period therefrom.

22. A method according to claim 21 wherein the apportioned quantity of the consumption in a sub-period is determined in dependence on a ratio of (a) the quantity of electricity consumption in the sub-period representing a group of outputs of the closure and (b) the quantity of electricity consumption of that group of outputs during the metered period of the metered output.

23. A method according to claim 22 wherein the consumption of the group of outputs of the closure is the total quantity of electricity supplied to the closure.

24. A method according to claim 22 wherein the consumption of the group of outputs of the closure is the total quantity of electricity supplied to the closure minus the consumption of one or more outputs of the closure.

25. A method of determining a charge with respect to consumption of electricity in an electricity distribution network having a plurality of outputs where the electricity is priced for successive half-hour periods, the network a closure, such that:

i) the inputs to the closure include substations at which the voltage is transformed down for entry into the closure, the voltage being transformed down at grid supply points;

ii) all inputs to the closure have half-hour metering; and iii) the closure including and being recorded as half-hourly data, one or more first outputs which are metered using half-hour metering, and one or more second outputs, which are metered over metered periods longer than half an hour, the method comprising:

a) determining a profile indicating a variation in the quantity of electricity supplied to the closure over half-hour periods by subtracting loss adjusted metered consumption for the half-hourly first metered outputs of the closure from the aggregate quantity of electricity supplied to the closure determined using the half-hour metering of the inputs to the closure;

b) metering each metered output to determine the quantity of electricity taken by that output over its metered period, said quantity of electricity being an indication of metered consumption;

c) determining an apportioned quantity of consumption in each half-hour for an aggregate of the second metered outputs to derive an indication of aggregate half-hour consumption, the aggregate of the second metered outputs being dependent on the quantities of metered consumption for the metered outputs, the profile, and a predetermined weighting for each half-hour;

d) forming a charge for the supply to the metered outputs dependent on the indication of aggregate half-hour consumption;

e) before consumption data for each of the metered outputs becomes available, determining one or more interim charges for the supply;

f) when actual metered consumption data become available, modifying the interim charges by reference to the actual metered consumption data; and g) adjusting the charge using a scalar adjustment such that the aggregate of all charges in a half-hour period equals the cost of electricity with respect to all electricity supplied to the closure during that period.

26. Apparatus for determining charges for the consumption of electricity supplied from an electricity distribution network and priced in successive sub-periods, the network incorporating a closure having one or more input supply connections all of which are metered and output connections including at least one metered output, the apparatus comprising:

means using information derived from the metered inputs to the closure for determining profile indicating variations in a quantity of electricity supplied tot he closure over the sub-periods;

metering apparatus for each metered output for determining the quantity of electricity taken by that output over a metered period, longer than each sub-period, for that output;

means for determining an apportionment of the quantity of metered consumption between the sub-periods in dependence on the profile; and charging means for determining the charge for the consumption in dependence on the quantity of metered consumption and the apportionment.

27. Apparatus according to claim 26 wherein the charging means comprises means for forming a single aggregate charge for the supply to a plurality of closure outputs.

28. Apparatus according to claim 26 wherein the charging means includes means for apportioning quantities of the metered consumption for a plurality of the metered outputs for determining an apportioned quantity of the consumption in the sub-periods for the aggregate of metered outputs.

29. Apparatus according to claim 26 wherein the profile is dependent on the quantity of electricity supplied to the closure over the sub-periods.

30. Apparatus according to claim 26 wherein the profile is dependent on the quantity of electricity supplied to the closure over the sub-periods minus the quantity of consumption for at least some of the outputs of the closure.

31. Apparatus according to claim 26 wherein the profile is additionally dependent on a predetermined weighting for each sub-period.

32. Apparatus according claims 26 wherein the charging means makes an adjustment for electricity distribution losses in the closure.

33. Apparatus according to claim 26 further including means for determining one or more interim charges for the consumption before consumption data for the metered output become available, and subsequently modifying the interim charges by reference to the actual consumption.

34. Apparatus of claim 26 wherein the adjustment is a scalar adjustment.

35. Apparatus according to claim 26 wherein the closure comprises a national electricity transmission network.

36. Apparatus according to claim 26 wherein the charging means includes means for making an adjustment to a determined charge such that the total of all charges with respect to all electricity supplied by the closure equals the cost of that electricity.

37. Apparatus according to claim 26 wherein the charging means includes means for making an adjustment to a determined charge such that the total of all charges with respect to all electricity supplied by the closure differs from the cost of that electricity by a desired amount.

38. Apparatus according to claim 26 wherein the charging means includes means for dividing the collective value of electricity supplied during a sub-period, said collective value representing the value of electricity consumed by a group of closure outputs, by the collective quantity of electricity supplied to said group of closure outputs during the metered period of the metered output.

39. Apparatus according to claim 38 wherein the group of closure outputs includes all closure outputs, the collective value of electricity supplied during the sub-period being determined by aggregating the value of all electricity supplied to the closure during the sub-period, and the collective quantity of electricity supplied being determined by aggregating the quantity of electricity supplied to the closure.

40. Apparatus according to claim 38 wherein:

the collective value of electricity supplied during the sub-period is determined by aggregating the value of all electricity supplied to the closure during the sub-period and subtracting the value of electricity supplied to those closure outputs not within said group of outputs, and the collective quantity of electricity supplied is determined by aggregating the quantity of electricity supplied to the closure and subtracting the consumption of those closure outputs not within said group of outputs.

41. Apparatus according to claim 26 wherein the charging means includes means for apportioning the quantity of metered consumption for each metered output for determining an apportioned quantity of the consumption in a sub-period and for determining a charge for the sub-period therefrom.

42. Apparatus according to claim 41 wherein the apportioned quantity of the consumption in a sub-period is determined in dependence on the ratio of (a) the quantity of electricity consumption in the sub-period representing a group of outputs of the closure and (b) the quantity of electricity consumption of that group of outputs during the metered period of the metered output.

43. Apparatus according to claim 42 wherein the consumption of the group of outputs of the closure is the total quantity of electricity supplied to the closure.

44. Apparatus according to claim 42 wherein the consumption of the group of outputs of the closure is the total quantity of electricity supplied to the closure minus the consumption of one or more outputs of the closure.

45. Apparatus according to claim 26 wherein the closure is supplied by a plurality of generating companies and further including means for determining, with respect to charges determined for electricity supplied by the closure to the outputs of the closure, a ratio of charges partitioned between the generating companies.

46. Apparatus according to claim 45 wherein the ratio is determined with respect to an input point.

47. Apparatus according to claim 45 wherein the ratio is determined with respect to all inputs to the closure.

48. Apparatus according to claim 45 wherein the ratio is determined with respect to one or more outputs of the closure.

* * * * *